United States Patent
Sukekawa

(10) Patent No.: US 11,049,864 B2
(45) Date of Patent: Jun. 29, 2021

(54) APPARATUSES INCLUDING CAPACITOR STRUCTURES, AND RELATED MEMORY DEVICES, ELECTRONIC SYSTEMS, AND METHODS

(71) Applicant: Micron Technology, Inc., Boise, ID (US)

(72) Inventor: Mitsunari Sukekawa, Tokyo (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/416,025

(22) Filed: May 17, 2019

(65) Prior Publication Data

US 2020/0365595 A1 Nov. 19, 2020

(51) Int. Cl.
| H01L 27/108 | (2006.01) |
| G11C 11/4074 | (2006.01) |
| H01L 29/94 | (2006.01) |
| H01L 49/02 | (2006.01) |

(52) U.S. Cl.
CPC .... *H01L 27/10861* (2013.01); *G11C 11/4074* (2013.01); *H01L 27/10829* (2013.01); *H01L 28/60* (2013.01); *H01L 29/945* (2013.01)

(58) Field of Classification Search
CPC .......... G11C 11/4074; H01L 27/10861; H01L 27/10829; H01L 28/60; H01L 29/945
USPC ........................................................ 365/149
See application file for complete search history.

(56) References Cited

U.S. PATENT DOCUMENTS

| 6,165,833 | A | 12/2000 | Parekh et al. | |
| 6,200,874 | B1 | 3/2001 | Sandhu et al. | |
| 6,551,893 | B1 | 4/2003 | Zheng et al. | |
| 6,617,206 | B1* | 9/2003 | Sandhu | H01L 21/31654 438/240 |
| 7,164,165 | B2 | 1/2007 | Basceri et al. | |
| 7,705,383 | B2* | 4/2010 | Keeth | H01L 27/105 257/296 |
| 7,713,813 | B2* | 5/2010 | Raghu | H01L 27/10894 438/243 |
| 7,829,410 | B2* | 11/2010 | Plum | H01L 27/10852 438/244 |
| 7,939,877 | B2* | 5/2011 | Kennedy | H01L 27/10852 257/306 |
| 10,396,104 | B2* | 8/2019 | Gu | H01L 28/90 |
| 2002/0173096 | A1* | 11/2002 | Okudaira | H01L 21/76885 438/253 |
| 2008/0206950 | A1* | 8/2008 | Bhat | H01L 28/91 438/397 |
| 2011/0279979 | A1* | 11/2011 | Mirin | H01L 23/3736 361/708 |
| 2012/0187533 | A1* | 7/2012 | Goodner | H01L 28/90 257/532 |
| 2013/0178025 | A1* | 7/2013 | Haller | H01L 27/10876 438/253 |

(Continued)

*Primary Examiner* — Sung Il Cho
(74) *Attorney, Agent, or Firm* — TraskBritt

(57) ABSTRACT

An apparatus comprises first electrodes vertically extending through an isolation material, a second electrode horizontally intervening between two or more of the first electrodes laterally neighboring one another, and a dielectric structure horizontally and vertically intervening between the second electrode and the two or more of the first electrodes. Additional apparatuses, memory devices, electronic systems, and a method of forming an apparatus are also described.

22 Claims, 20 Drawing Sheets

(56) References Cited

U.S. PATENT DOCUMENTS

| | | | | |
|---|---|---|---|---|
| 2014/0015097 A1* | 1/2014 | Greeley | ................... | H01L 28/65 |
| | | | | 257/532 |
| 2015/0294971 A1* | 10/2015 | Sapra | ................ | H01L 21/02052 |
| | | | | 257/532 |
| 2017/0040327 A1* | 2/2017 | Nobuto | ............. | H01L 21/28568 |
| 2018/0061835 A1* | 3/2018 | Yang | ................. | H01L 29/42376 |
| 2018/0061840 A1* | 3/2018 | Sills | .................. | H01L 21/76897 |
| 2018/0130515 A1* | 5/2018 | Zawodny | ............. | G11C 7/1006 |

* cited by examiner

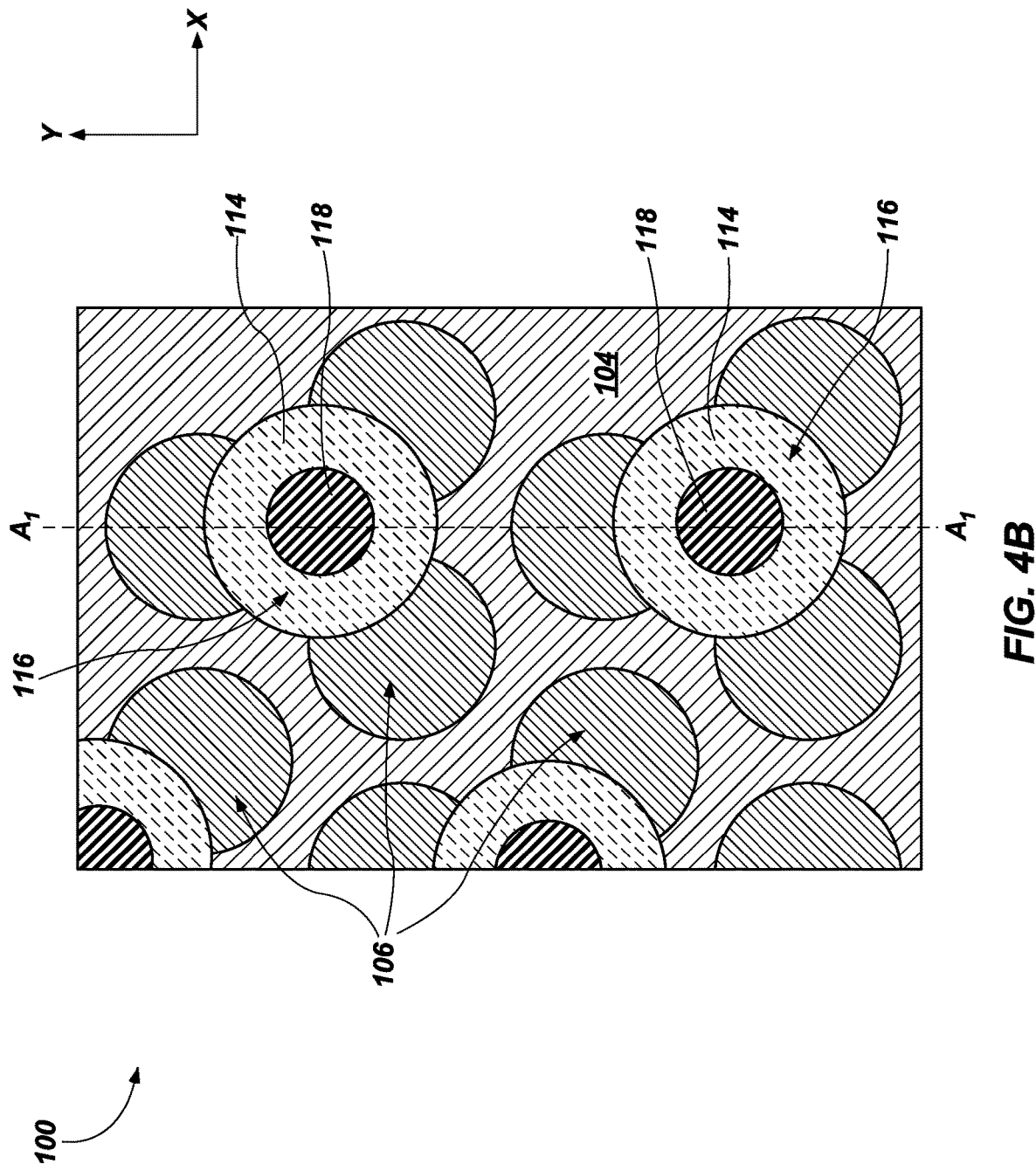

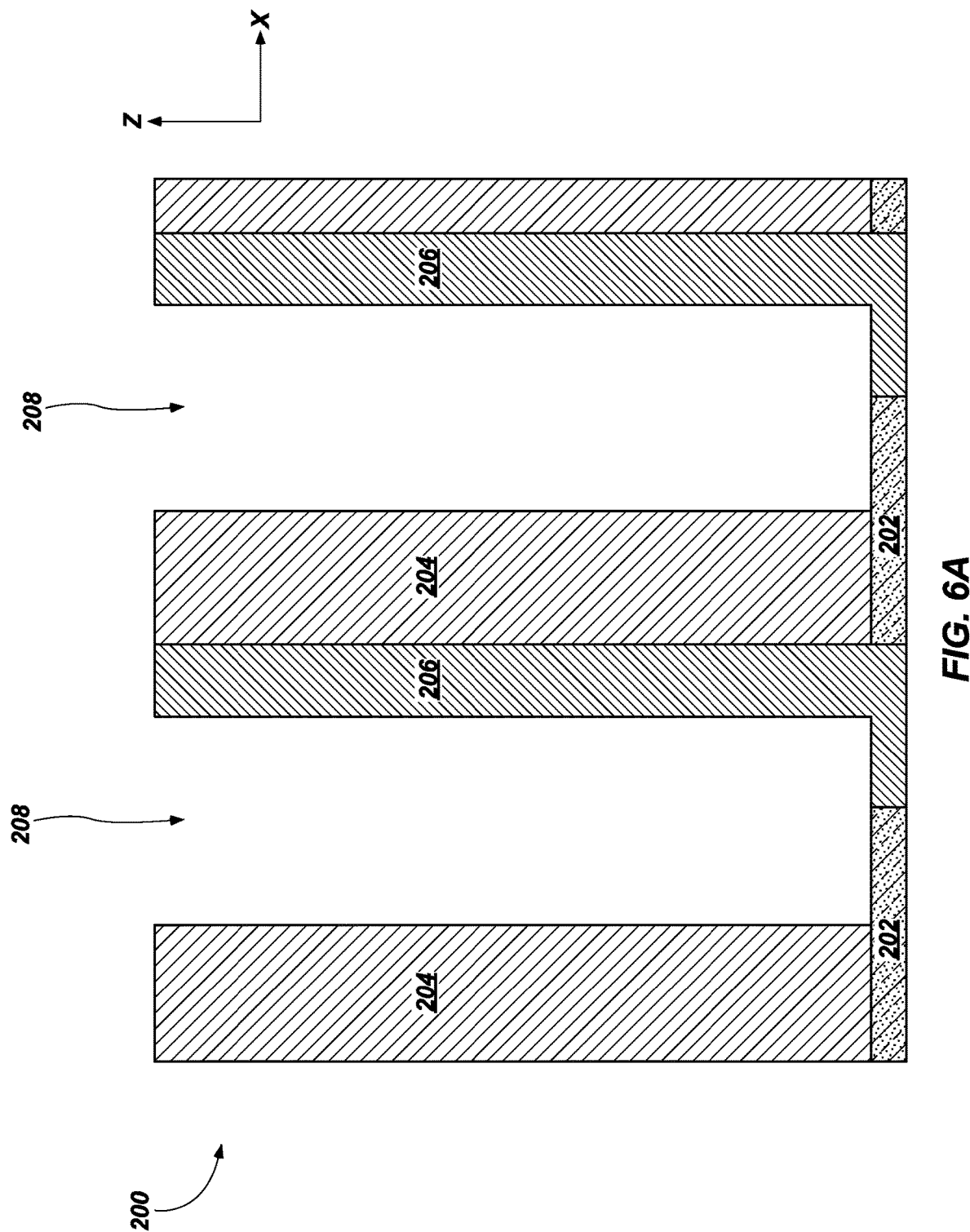

APPARATUSES INCLUDING CAPACITOR STRUCTURES, AND RELATED MEMORY DEVICES, ELECTRONIC SYSTEMS, AND METHODS

TECHNICAL FIELD

Embodiments of the disclosure relate to the field of electronic device design and fabrication. More specifically, embodiments of the disclosure relate to apparatuses including capacitor structures, and to related memory devices, electronic systems, and methods.

BACKGROUND

Electronic device (e.g., semiconductor device) designers often desire to increase the level of integration or density of features within an electronic device by reducing the dimensions of the individual features and by reducing the separation distance between neighboring features. In addition, electronic device designers often desire to design architectures that are not only compact, but offer performance advantages, as well as simplified designs.

A relatively common electronic device is a memory device. As used herein, the term "memory device" means and includes an electronic device incorporating, but not limited to, a memory structure and function. A memory device may include a memory array having a number of memory cells arranged in a grid pattern. One type of memory cell is a dynamic random access memory (DRAM). In the simplest design configuration, a DRAM cell includes one access device, such as a transistor, and one storage device, such as a capacitor. Modern applications for memory devices can utilize vast numbers of DRAM unit cells, arranged in an array of rows and columns. A typical access device for a DRAM cell includes a channel region between a pair of source/drain regions, and a gate configured to electrically connect the source/drain regions to one another through the channel region. A typical capacitor for a DRAM cell includes two electrodes and a dielectric structure (e.g., a dielectric film) intervening between and separating the two electrodes. The DRAM cells of a DRAM device are electrically accessible through digit lines and word lines arranged along the rows and columns of the array.

DRAM device manufacturers face significant challenges with reducing DRAM cell area as feature spacing decreases to accommodate increased feature density. The quantities, dimensions, and arrangements of the different features employed within the DRAM device can undesirably impede reductions to the size of a DRAM device, increases to the storage density of the DRAM device, and/or reductions in fabrication costs. For example, the configurations of conventional capacitors for DRAM cells for DRAM devices can impede or prevent desirable reductions in the spacing between laterally-neighboring DRAM cells including the conventional capacitors.

A need, therefore, exists for apparatuses including new capacitor configurations, as well as for associated electronic devices (e.g., memory devices), electronic systems, and methods of forming an apparatus.

DETAILED DESCRIPTION

Figure 1A:
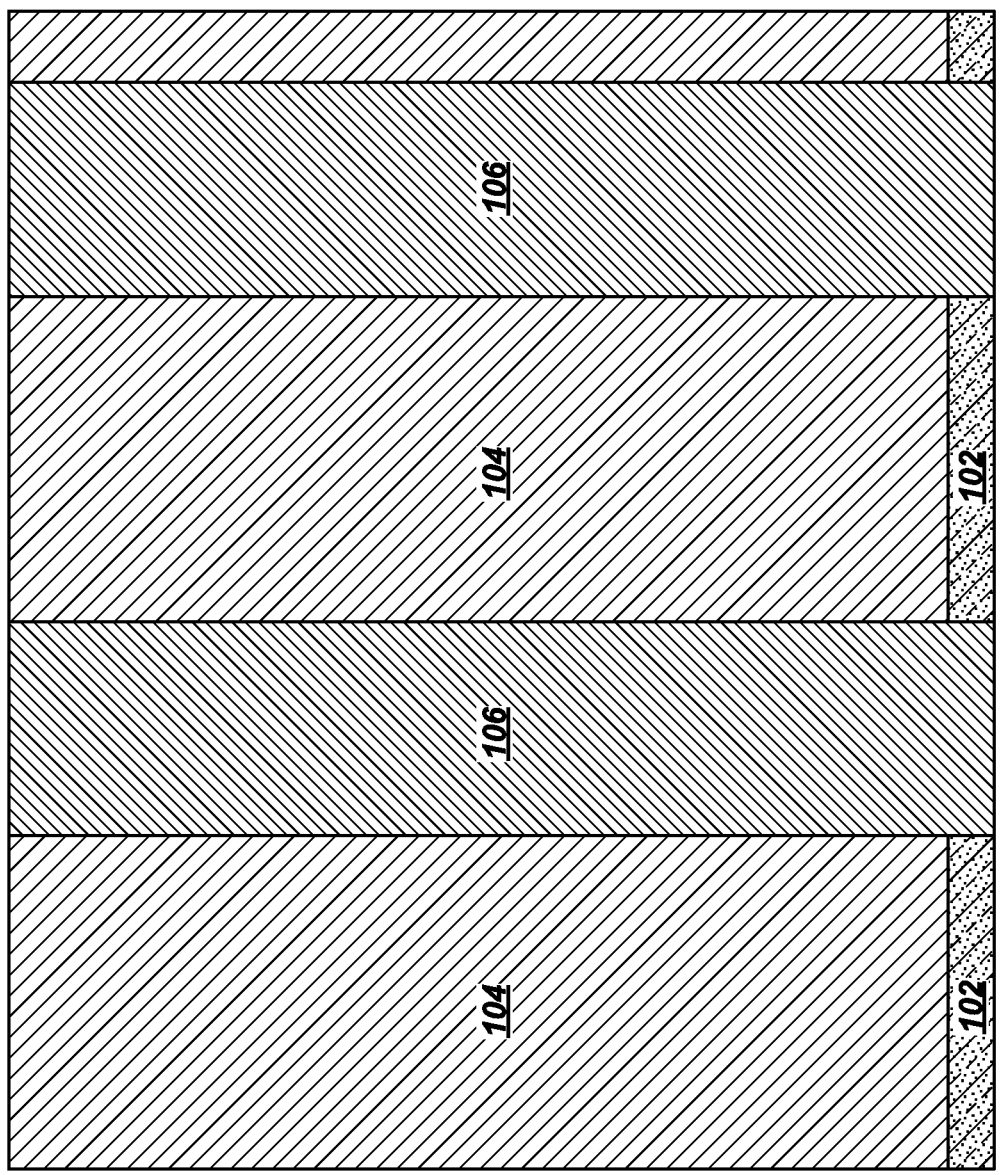
FIGS. 1A through 5B are simplified partial cross-sectional (i.e., FIGS. 1A, 2A, 3A, 4A, and 5A) and simplified partial top-down (i.e., FIGS. 1B, 2B, 3B, 4B, and 5B) views illustrating embodiments of a method of forming an electronic device, in accordance with embodiments of the disclosure.

Apparatuses including capacitor structures are described herein, as are related memory devices, electronic systems, and methods of forming apparatuses. In some embodiments, an apparatus comprises first electrodes (e.g., lower capacitor electrodes) vertically extending through an isolation material (e.g., a dielectric material), a second electrode (e.g., an upper capacitor electrode) horizontally intervening between two or more (e.g., at least three) laterally-neighboring first electrodes, a dielectric structure (e.g., a capacitor dielectric structure) horizontally and vertically intervening between the second electrode and the two or more laterally-neighboring first electrodes, and a third electrode (e.g., a plate electrode) vertically overlying (e.g., on) and in electrical communication with the first electrodes and the second electrode. The structures, apparatuses, and methods of the disclosure may facilitate increased feature density, providing enhanced performance in electronic devices (e.g., memory devices, such as DRAM devices) and electronic systems that rely on high feature density.

The following description provides specific details, such as material species, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete process flow for manufacturing an electronic device (e.g., a semiconductor device, a memory device). The electronic device structures described below do not form a complete electronic device. Only those process acts and structures necessary to understand the embodiments of the disclosure are described in detail below. Additional acts to form the complete electronic device from the electronic device structures may be performed by conventional fabrication techniques. Also note, any drawings accompanying the application are for illustrative purposes only, and are thus not drawn to scale. Additionally, elements common between figures may retain the same numerical designation.

As used herein, the term "substrate" means and includes a base material or construction upon which additional materials are formed. The substrate may be a semiconductor substrate, a base semiconductor layer on a supporting structure, a metal electrode, or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-oninsulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. By way of non-limiting example, a substrate may comprise at least one of silicon, silicon dioxide, silicon with native oxide, silicon nitride, a carbon-containing silicon nitride, glass, semiconductor, metal oxide, metal, titanium nitride, carbon-containing titanium nitride, tantalum, tantalum nitride, carbon-containing tantalum nitride, niobium, niobium nitride, carbon-containing niobium nitride, molybdenum, molybdenum nitride, carbon-containing molybdenum nitride, tungsten, tungsten nitride, carbon-containing tungsten nitride, copper, cobalt, nickel, iron, aluminum, and a noble metal.

As used herein, the term "configured" refers to a size, shape, material composition, material distribution, orientation, and arrangement of one or more of at least one structure and at least one apparatus facilitating operation of one or more of the structure and the apparatus in a predetermined way.

As used herein, the singular forms "a," "an," and "the" are intended to include the plural forms as well, unless the context clearly indicates otherwise.

As used herein, "and/or" includes any and all combinations of one or more of the associated listed items.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, "vertically-neighboring" or "longitudinally-neighboring" features (e.g., structures, devices) means and includes features located most vertically proximate (e.g., vertically closest) one another. In addition, as used herein, "horizontally-neighboring" or "laterally-neighboring" features (e.g., structures, devices) means and includes features located most horizontally proximate (e.g., horizontally closest) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

FIGS. 1A through 5B are simplified partial cross-sectional (i.e., FIGS. 1A, 2A, 3A, 4A, and 5A) and simplified partial top-down (i.e., FIGS. 1B, 2B, 3B, 4B, and 5B) views illustrating embodiments of a method of forming an apparatus (e.g., an electronic device; a semiconductor device; a memory device, such as a DRAM device). With the description provided below, it will be readily apparent to one of ordinary skill in the art that the methods described herein may be used in various devices. In other words, the methods of the disclosure may be used whenever it is desired to form an apparatus.

Figure 1B:
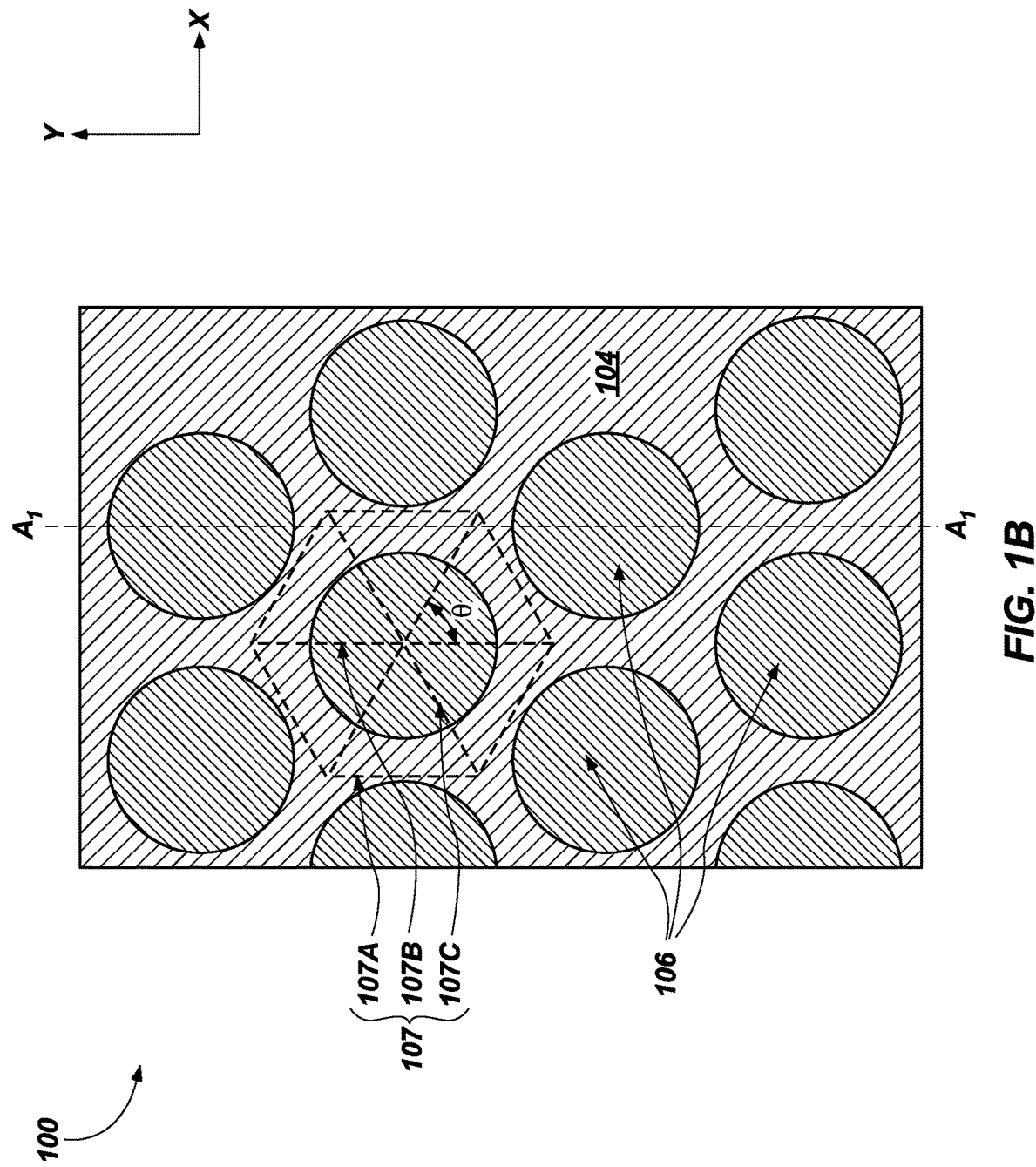

Referring to FIG. 1A, an apparatus 100 may include an etch stopping material 102, an isolation material 104 (e.g., an interlayer dielectric (ILD) material) on or over the etch stopping material 102, and first capacitor electrodes 106 vertically extending through the isolation material 104 and the etch stopping material 102. The etch stopping material 102 may be located on or over a base structure (e.g., a substrate, such as a semiconductor substrate) including access devices (e.g., access transistors) of memory cells. As shown in FIG. 1A, the first capacitor electrodes 106 may each individually vertically (e.g., longitudinally) extend from an upper surface of the isolation material 104 to (or beyond) a lower surface of the etch stopping material 102. The first capacitor electrodes 106 may be in electrical contact with conductive structures (e.g., conductive plugs) vertically underlying the etch stopping material 102. The conductive structures may, for example, be in electrical communication with contact regions (e.g., one of source and drain regions) of access devices within the base structure underlying the etch stopping material 102. FIG. 1B is a simplified partial top-down of the apparatus 100 at the process stage depicted in FIG. 1A.

The etch stopping material 102 may be formed of and include one or more dielectric materials having etch selectivity relative to the isolation material 104 and the first capacitor electrodes 106. As described in further detail below, portions of the isolation material 104 and the first capacitor electrodes 106 may be removed through exposure to at least one etchant, but portions of the etch stopping material 102 may not be substantially removed through exposure to the relative to the at least one etchant. The etch stopping material 102 may protect one or more of structures, materials, and features thereunder from being removed during subsequent processing of the apparatus 100, as described in further detail below. The material composition of the etch stopping material 102 may at least partially depend on the material compositions of the isolation material 104 and the first capacitor electrodes 106. The etch stopping material 102 may, for example, comprise a dielectric material having a different material composition than that of the isolation material 104. In some embodiments, the etch stopping material 102 is formed of and includes silicon nitride ($Si_3N_4$).

The isolation material 104 may be formed of and include one or more dielectric materials. By way of non-limiting example, the isolation material 104 may be formed of and include one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), and a titanium oxide ($TiO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x", "y", and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, the isolation material 104 may comprise one or more stoichiometric compounds and/or one or more non-stoichiometric compounds, and values of "x", "y", and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In some embodiments, the isolation material 104 is formed of and includes silicon dioxide ($SiO_2$). The isolation material 104 may be substantially homogeneous throughout a thickness (e.g., vertical height in the Z-direction) thereof, or may be substantially heterogeneous throughout the thickness thereof. In some embodiments, the isolation material 104 is substantially homogeneous throughout the thickness thereof. For example, the isolation material 104 may formed of and include a single (e.g., only one) dielectric material. In additional embodiments, the isolation material 104 is substantially heterogeneous throughout the thickness thereof. For example, the isolation material 104 may be formed of and include a stack (e.g., laminate) of at least two different dielectric materials.

The first capacitor electrodes 106 (e.g., lower capacitor electrodes) may be formed of and include at least one electrically conductive material, such as one or more of a metal, an alloy, a conductive metal oxide, a conductive metal nitride, a conductive metal silicide, and a conductively doped semiconductor material. By way of non-limiting example, the first capacitor electrodes 106 may be formed of and include one or more of tungsten (W), tungsten nitride (WN), nickel (Ni), tantalum (Ta), tantalum nitride (TaN), tantalum silicide (TaSi), platinum (Pt), copper (Cu), silver (Ag), gold (Au), aluminum (Al), molybdenum (Mo), titanium (Ti), titanium nitride (TiN), titanium silicide (TiSi), titanium silicon nitride (TiSiN), titanium aluminum nitride (TiAN), molybdenum nitride (MoN), iridium (Ir), iridium oxide ($IrO_x$), ruthenium (Ru), ruthenium oxide ($RuO_x$), and conductively doped silicon. In some embodiments, each of the first capacitor electrodes 106 is formed of and includes Ru. In further embodiments, each of the first capacitor electrodes 106 is formed of and includes TiN.

The first capacitor electrodes 106 may each individually exhibit a generally columnar shape (e.g., a circular column shape, a rectangular column shape). In some embodiments, each of the first capacitor electrodes 106 exhibits a circular column shape having substantially circular lateral cross-sectional shape. Each of the first capacitor electrodes 106 may exhibit substantially the same dimensions (e.g., substantially the same diameter, substantially the same height), substantially the same shape, and substantially the same spacing (e.g., in the X-direction and the Y-direction) as each other of the first capacitor electrodes 106. In additional embodiments, at least one of the first capacitor electrodes 106 may exhibit one or more of at least one different dimension and a different shape than one or more other of the first capacitor electrodes 106, and/or the spacing between at least two laterally-neighboring first capacitor electrodes 106 may be different than the spacing between at least two other laterally-neighboring first capacitor electrodes 106. The dimensions, shape, and spacing of the first capacitor electrodes 106 may be selected to provide desired dimensions, shapes, and spacing to one or more subsequently formed structures of the apparatus 100, as described in further detail below.

As shown in FIG. 1A, upper surfaces of the first capacitor electrodes 106 may be substantially coplanar with an upper surface of the isolation material 104. Put another way, vertically uppermost boundaries of the first capacitor electrodes 106 may be substantially coplanar with vertically uppermost boundaries of the isolation material 104.

As shown in FIG. 1B, the apparatus 100 includes a hexagonal pattern (e.g., a hexagonal arrangement, a hexagonal grid, a hexagonal array) of the first capacitor electrodes 106. The first capacitor electrodes 106 may be arranged as a hexagonal close-packed capacitor array. The hexagonal pattern exhibits a repeating lateral arrangement of seven (7) first capacitor electrodes 106, wherein one (1) of the seven (7) first capacitor electrodes 106 is substantially laterally centered between six (6) other of the seven (7) first capacitor electrodes 106. The hexagonal pattern exhibits different three (3) axes of symmetry 107 (e.g., a first axis of symmetry 107A, a second axis of symmetry 107B, and a third axis of symmetry 107C) in the same lateral plane (e.g., the XY plane) about a center of the laterally-centered first capacitor electrode 106 of the seven (7) first capacitor electrodes 106. Different axes of symmetry 107 directly radially adjacent to one another (e.g., the first axis of symmetry 107A and the second axis of symmetry 107B, the second axis of symmetry 107B and the third axis of symmetry 107C) may be radially separated from one another by an angle θ of about 60 degrees. The hexagonal pattern of the first capacitor electrodes 106 exhibits a smaller lateral area relative to a conventional square pattern having the same type and quantity of first electrodes.

The etch stopping material 102, the isolation material 104, and the first capacitor electrodes 106 may be formed using conventional processes (e.g., conventional material deposition processes, conventional photolithography processes, conventional material removal processes) and conventional processing equipment, which are not described in detail herein. For example, the etch stopping material 102 may be formed on or over one or more structures and devices through at least one material deposition process (e.g., a PVD process, a CVD process; an ALD process; a spin-coating process), and then the isolation material 104 may be formed on or over the etch stopping material 102 through at least one material deposition process (e.g., a PVD process, a CVD process; an ALD process; a spin-coating process). Thereafter the isolation material 104 and the etch stopping material 102 may be subjected to at least one etching process (e.g., one or more of reactive ion etching (RIE), deep RIE, plasma etching, reactive ion beam etching, and chemically assisted ion beam etching) to form openings extending through the isolation material 104 and the etch stopping material 102. Thereafter, a conductive material may be formed (e.g., deposited) on exposed surfaces of the isolation material 104 and the etch stopping material 102 inside and outside of the openings to fill (e.g., substantially fill) the openings. At least portions of the conductive material outside of the boundaries of the filled openings may then be removed (e.g., through at least one CMP process) to form the first capacitor electrodes 106.

Figure 2A:
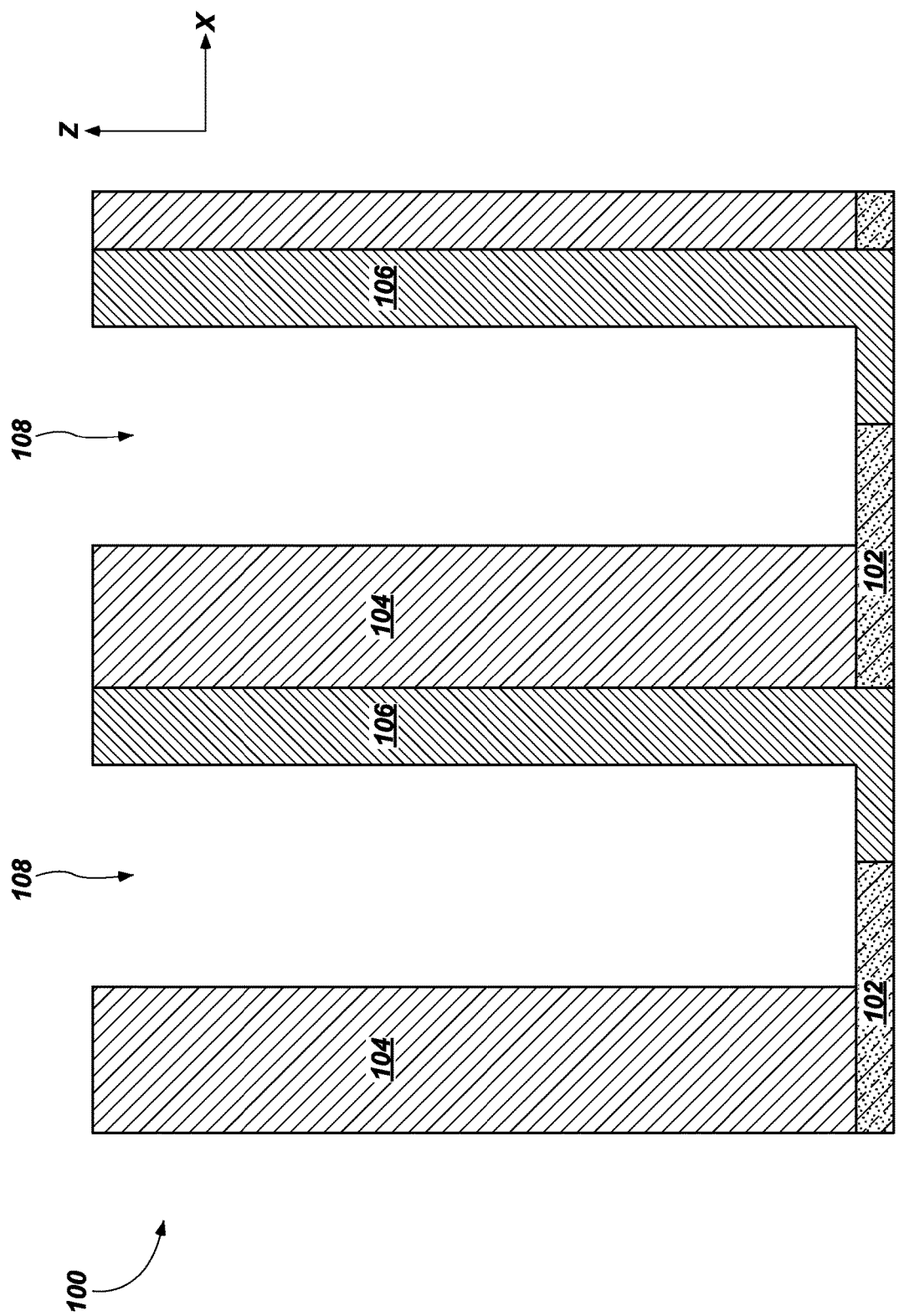
Figure 2B:
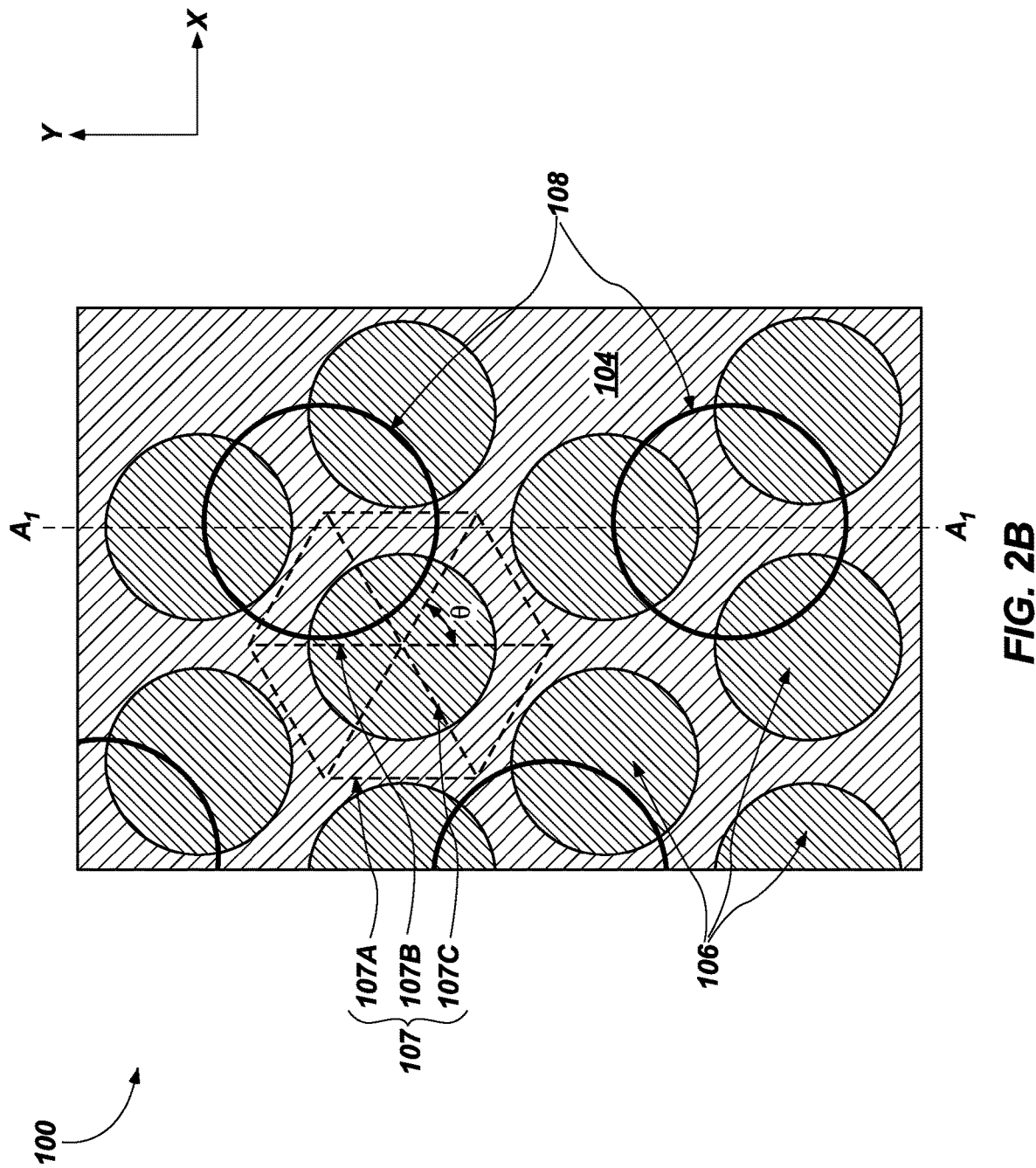

Referring next to FIG. 2A, portions of the isolation material 104 and the first capacitor electrodes 106 may be removed to form openings 108 vertically-extending (e.g., in the Z-direction shown in FIG. 2A) to the etch stopping material 102 and horizontally intervening (e.g., in the X-direction and the Y-direction) between laterally-neighboring first capacitor electrodes 106. As shown in FIG. 2A, portions of the first capacitor electrodes 106 vertically at or below upper surfaces of the etch stopping material 102 may remain following the formation of the openings 108. FIG. 2B is a simplified partial top-down of the apparatus 100 at the process stage depicted in FIG. 2A.

The size, shape, and spacing of each of the openings 108 may at least partially depend upon the size, shape, and spacing of additional structures to be formed within the openings 108, as described in further detail below. For example, the openings 108 may each individually exhibit a generally columnar shape (e.g., a circular column shape, a rectangular column shape). In some embodiments, each of the openings 108 exhibits a circular column shape having substantially circular lateral cross-sectional shape.

As shown in FIG. 2B, each of the openings 108 may horizontally intervene between three (3) laterally-neighboring first capacitor electrodes 106. For each of the openings 108, a lateral center of the opening 108 may be positioned at a location laterally equidistant from each of the three (3) laterally-neighboring first capacitor electrodes 106 associated therewith. Each of the openings 108 may substantially equally laterally extend beyond outermost lateral boundaries of each of the three (3) laterally-neighboring first capacitor electrodes 106 associated therewith. The apparatus 100 at the process stage depicted in FIGS. 2A and 2B may be formed to include a hexagonal pattern (e.g., a hexagonal arrangement, a hexagonal grid, a hexagonal array) of the openings 108. The hexagonal pattern of the openings 108 may exhibit a repeating lateral arrangement of seven (7) openings 108, wherein one (1) of the seven (7) openings 108 is substantially laterally centered between six (6) other of the seven (7) openings 108.

The openings 108 may be formed in the isolation material 104 and the first capacitor electrodes 106 using conventional processes, which are not described in detail herein. By way of non-limiting example, portions of the isolation material 104 and the first capacitor electrodes 106 may be subjected to at least one anisotropic etching process (e.g., an anisotropic dry etching process, such as one or more of RIE, deep RIE, plasma etching, reactive ion beam etching, and chemically assisted ion beam etching) to form the openings 108.

Figure 3A:
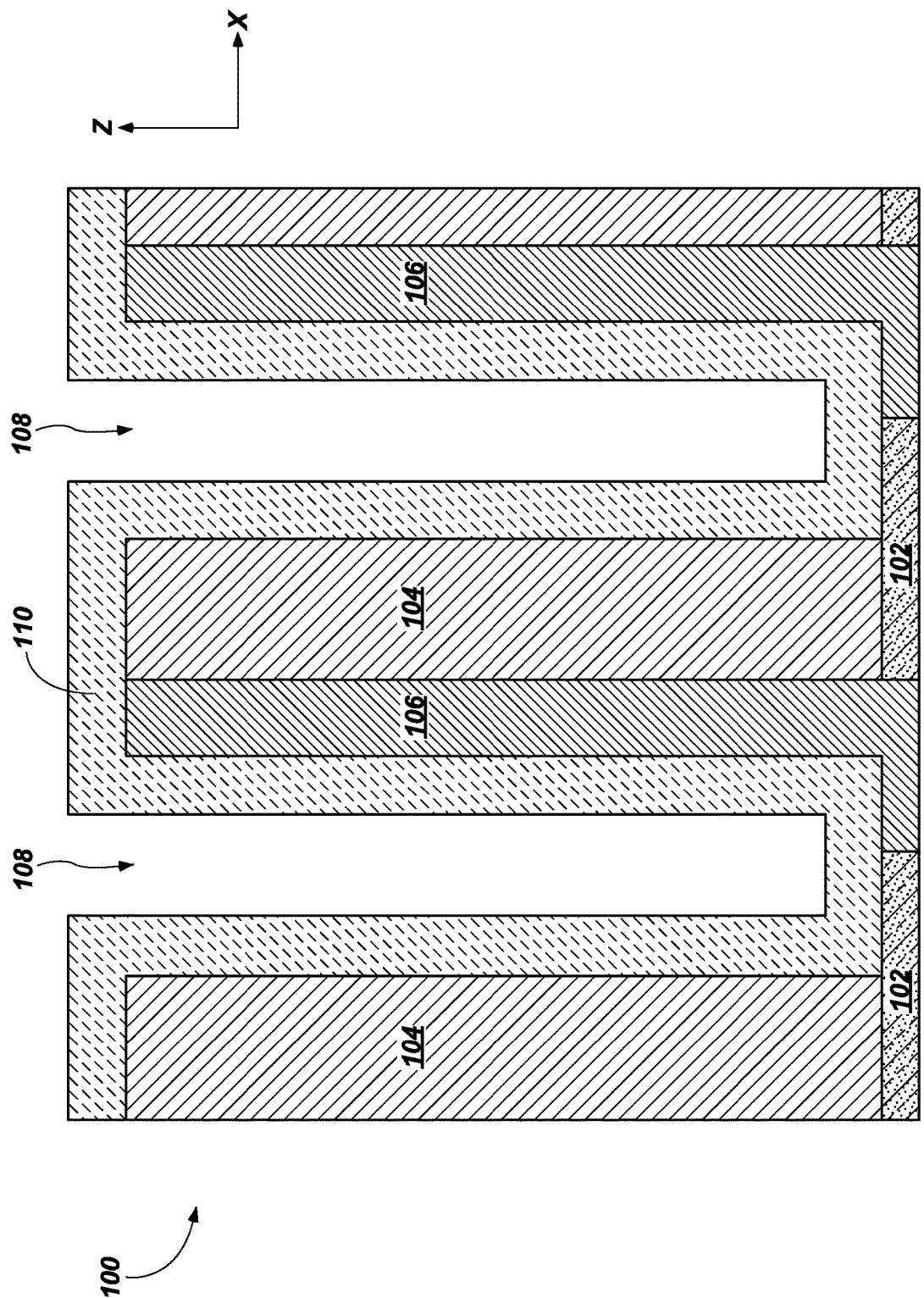
Figure 3B:
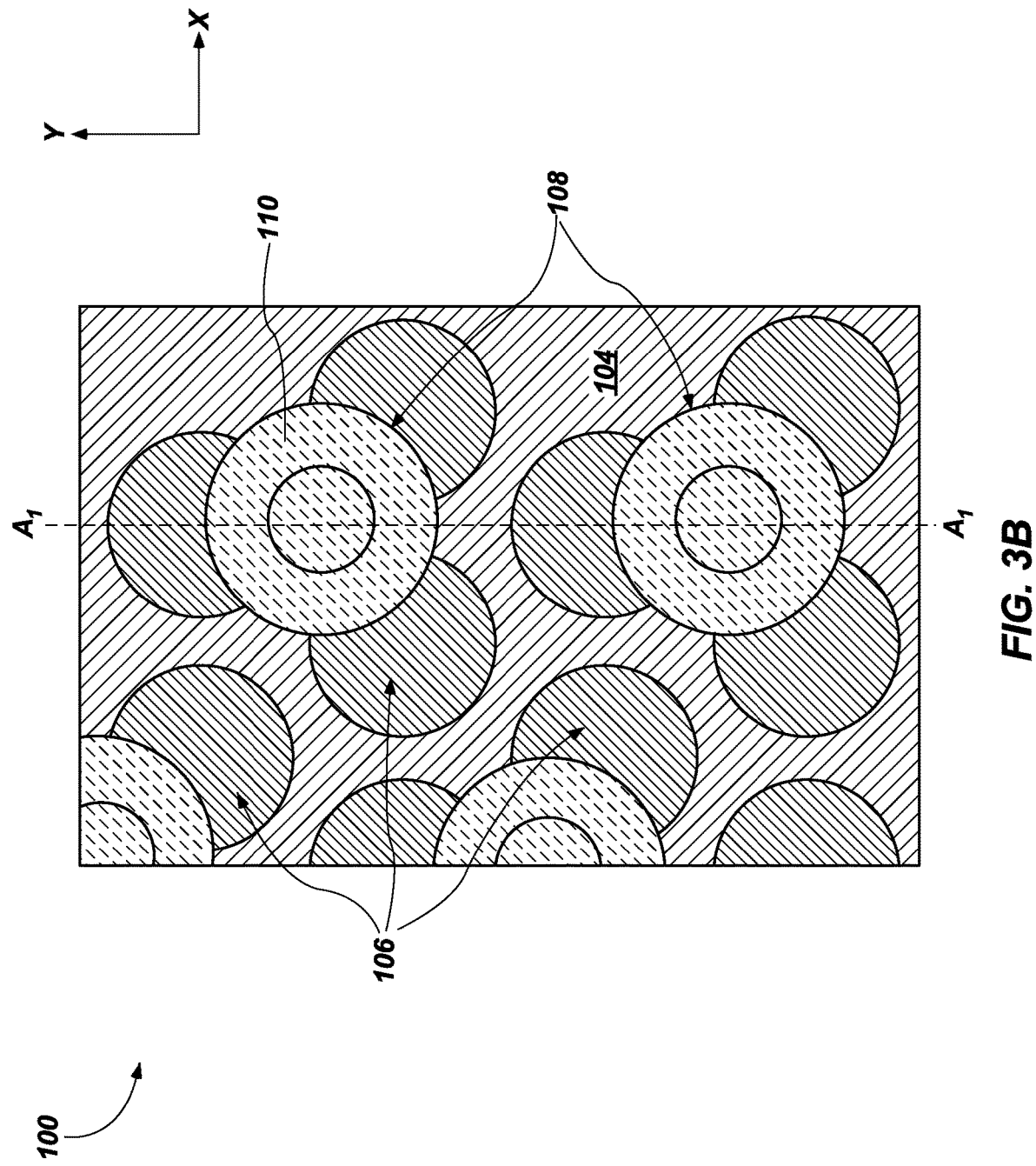

Referring next to FIG. 3A, a capacitor dielectric material 110 may be formed on or over exposed (e.g., uncovered, bare) surfaces of the apparatus 100 (e.g., exposed surfaces of the isolation material 104 and the first capacitor electrodes 106). As shown in FIG. 3A, the capacitor dielectric material 110 may at least partially (e.g., substantially) conform to a topography defined by the surfaces (e.g., upper surfaces, side surfaces) upon which the capacitor dielectric material 110 is formed. The capacitor dielectric material 110 may extend (e.g., continuously extend) over surfaces (e.g., upper surfaces, side surfaces) of isolation material 104 and the first capacitor electrodes 106 inside and outside of the openings 108. The capacitor dielectric material 110 partially (e.g., less than completely) fills the openings 108. The capacitor dielectric material 110 may be formed to any desired thickness, at least partially depending the lateral distances between the three (3) laterally-neighboring first capacitor electrodes 106 associated with each of the openings 108. FIG. 3B is a simplified partial top-down of the apparatus 100 at the process stage depicted in FIG. 3A, wherein the capacitor dielectric material 110 is depicted as transparent to show the other components of the apparatus 100 provided thereunder.

The capacitor dielectric material 110 may, for example, be formed of and include one or more of at least one dielectric oxide material (e.g., one or more of $TaO_x$, $NbO_x$, $SiO_x$, $AlO_x$, $HfO_x$, and $TiO_x$), at least one dielectric nitride material (e.g., $SiN_y$), at least one dielectric titanate material (e.g., one or more of barium titanate ($BaTiO_3$, abbreviated "BT"), strontium titanate ($SrTiO_3$, abbreviated "ST"), lead zirconium titanate ($PbTiZrO_3$, abbreviated "PZT"), and bismuth strontium titanate ($BaSrTiO_3$, abbreviated "BST")), and at least one dielectric fluoride material (e.g., one or more of a barium fluoride ($BaF_x$), and a magnesium fluoride ($MgF_x$)). In some embodiments, the capacitor dielectric material 110 is formed of and includes one or more of tantalum pentoxide ($Ta_2O_5$), niobium pentoxide ($Nb_2O_5$), BT, ST, PZT, PST, barium difluoride ($BaF_2$), and magnesium difluoride ($MgF_2$). In additional embodiments, the capacitor dielectric material 110 is formed of and includes one or more of $SiO_2$ and $Si_3N_4$.

The capacitor dielectric material 110 may be formed (e.g., conformally formed) using conventional processes (e.g., conventional conformal deposition processes), which are not described in detail herein. By way of non-limiting example, the capacitor dielectric material 110 may be formed on exposed surfaces of the isolation material 104 and the first capacitor electrodes 106 inside and outside of the openings 108 using one or more of a conventional CVD process (e.g., a conventional PECVD process) and a conventional ALD process. In some embodiments, the capacitor dielectric material 110 is formed using a CVD process.

Figure 4A:
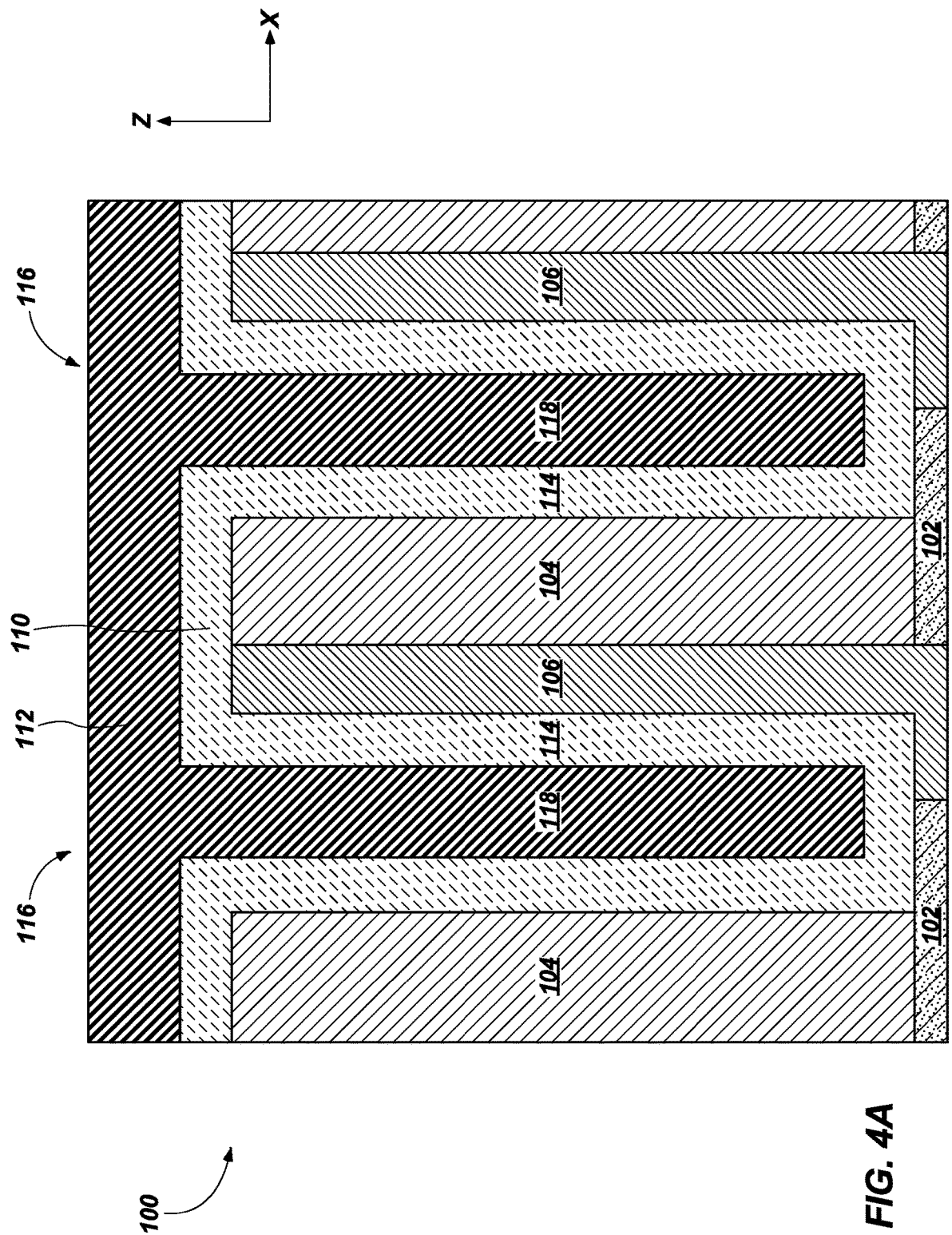

Referring next to FIG. 4A, a second capacitor electrode material 112 (e.g., an upper capacitor electrode material) may be formed on or over the capacitor dielectric material 110. The second capacitor electrode material 112 may substantially fill remainders of the openings 108 (FIGS. 3A and 3B). The second capacitor electrode material 112 may be substantially free of void spaces (e.g., air gaps) therein. The upper surface of the second capacitor electrode material 112 may be planarized as needed. As shown in FIG. 4A, the formation of the second capacitor electrode material 112 may effectuate the formation of capacitors 116 of the apparatus 100. Each of the capacitors 216 may individually include a first capacitor electrode 106, a second capacitor electrode 118 formed of a portion of the second capacitor electrode material 112, and a capacitor dielectric structure 114 formed of a portion of the capacitor dielectric material 110. FIG. 4B is a simplified partial top-down of the apparatus 100 at the process stage depicted in FIG. 4A.

As shown in FIG. 4A, each of the capacitor dielectric structures 114 may comprise a container-shaped structure, including and one or more sidewalls integral with a floor. The sidewalls and the floors the capacitor dielectric material 110 may substantially (e.g., completely) cover side surfaces and lower surfaces of the second capacitor electrodes 118. As shown in FIG. 4B, in some embodiments, each of the capacitor dielectric structures 114 includes a sidewall having a substantially annular the lateral cross-sectional shape. The second capacitor electrodes 118 may be substantially contained (e.g., confined) within boundaries (e.g., vertical boundaries, horizontal boundaries) of the capacitor dielectric structures 114. The capacitor dielectric structures 114 may each individually substantially physically separate the second capacitor electrode 118 contained therein from the first capacitor electrodes 106 laterally neighboring the second capacitor electrode 118. Put another way, the capacitor dielectric structures 114 may each individually horizontally and vertically intervene between the second capacitor electrode 118 contained therein and the first capacitor electrodes 106 laterally neighboring the second capacitor electrode 118.

The second capacitor electrode material 112, and hence the second capacitor electrodes 118, may be formed of and include at least one electrically conductive material, such as one or more of a metal, an alloy, a conductive metal oxide, a conductive metal nitride, a conductive metal silicide, and a conductively doped semiconductor material. By way of non-limiting example, the second capacitor electrode material 112 may be formed of and include one or more of W, WN, Ni, Ta, TaN, TaSi, Pt, Cu, Ag, Au, Al, Mo, Ti, TiN, TiSi, TiSiN, TiAN, MoN, Ir, $IrO_x$, Ru, $RuO_x$, and conductively doped silicon. A material composition of the second capacitor electrode material 112 (and, hence, of the second capacitor electrodes 118) may be substantially the same as the material composition of each of the first capacitor electrodes 106, or the material composition of one or more (e.g., each) of the second capacitor electrodes 118 may be different than the material composition of one or more (e.g., each) of the first capacitor electrodes 106. In some embodiments, each of the second capacitor electrode material 112 is formed of and includes Ru. In further embodiments, each of the second capacitor electrode material 112 is formed of and includes TiN.

Each of the second capacitor electrodes 118 may exhibit a size, a shape, and spacing complementary to a size, a shape, and spacing of the unfilled portion of the opening 108 (FIGS. 3A and 3B) within which the second capacitor electrode 118 is formed. The second capacitor electrodes 118 may, for example, each individually exhibit a generally columnar shape (e.g., a circular column shape, a rectangular column shape). In some embodiments, each of the second capacitor electrodes 118 exhibits a circular column shape having substantially circular lateral cross-sectional shape. Lateral dimensions (e.g., a diameter) of each of the second capacitor electrodes 118 may be smaller than lateral dimensions (e.g., a diameter) of each of the first capacitor electrodes 106. For each of the second capacitor electrodes 118, a lateral center of the second capacitor electrode 118 may be positioned at a location laterally equidistant from each of the three (3) laterally-neighboring first capacitor electrodes 106 associated therewith. Each of the second capacitor electrodes 118 may substantially equally laterally extend beyond outermost lateral boundaries of each of the three (3) laterally-neighboring first capacitor electrodes 106 associated therewith.

The second capacitor electrode material 112, and hence the second capacitor electrodes 118, may be formed using conventional processes (e.g., conventional material deposition processes) and conventional processing equipment, which are not described in detail herein. By way of non-limiting example, the second capacitor electrode material 112 may be deposited (e.g., non-conformally deposited through one or more of a PVD process and a CVD process) on surfaces of the capacitor dielectric material 110 (FIGS. 3A and 3B) inside and outside of the openings 108 (FIGS. 3A and 3B) to substantially fill remaining portions of the openings 108 (FIGS. 3A and 3B) and form the second capacitor electrodes 118.

Thus, an apparatus according to embodiments of the disclosure comprises first electrodes vertically extending through an isolation material, a second electrode horizontally intervening between two or more of the first electrodes laterally neighboring one another, and a dielectric structure horizontally and vertically intervening between the second electrode and the two or more of the first electrodes.

In addition, an apparatus according to additional embodiments of the disclosure comprises a first vertically-extending electrode; a second vertically-extending electrode; a third vertically-extending electrode; an opening between and partially defined by sidewalls of the first vertically-extending electrode, the second vertically-extending electrode, and the third vertically-extending electrode; a fourth vertically-extending electrode within the vertically-extending opening; and a dielectric material between the fourth vertically-extending electrode and the sidewalls of the first vertically-extending electrode, the second vertically-extending electrode, and the third vertically-extending electrode to form: a first capacitor between the first vertically-extending electrode and fourth vertically-extending electrode; a second capacitor between the second vertically-extending electrode and fourth vertically-extending electrode; and a third capacitor between the third vertically-extending electrode and fourth vertically-extending electrode.

Furthermore, in accordance with embodiments of the disclosure, a method of forming an apparatus comprises forming first electrodes vertically extending through an isolation material. Portions of the first electrodes and the isolation material are removed to form openings each individually horizontally intervening between two or more of the first electrodes laterally neighboring one another. A dielectric material is formed over surfaces of the first electrodes and the isolation material inside and outside of the openings. A conductive material is formed over the dielectric material to fill remaining portions of the openings.

Figure 5A:
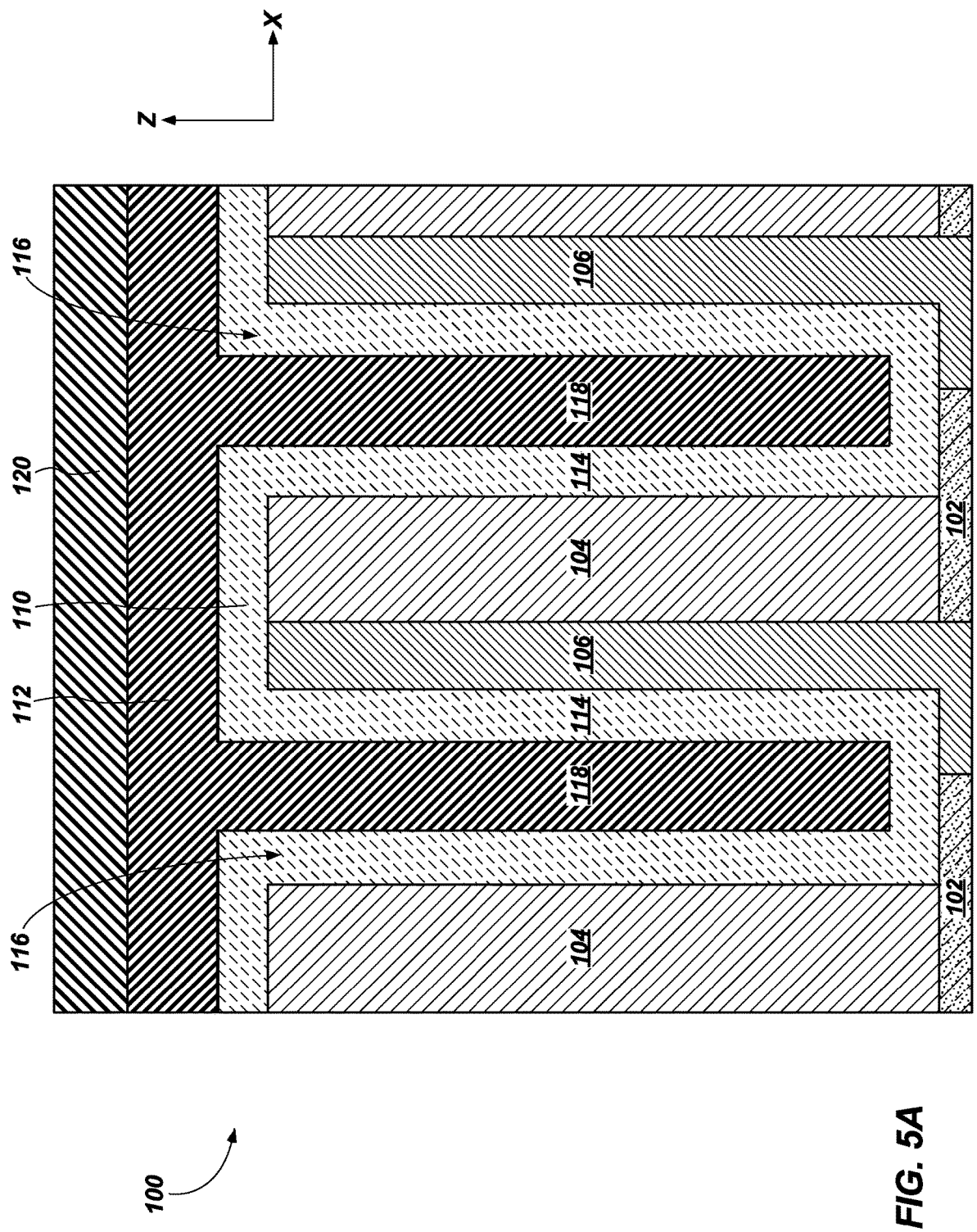
Figure 5B:
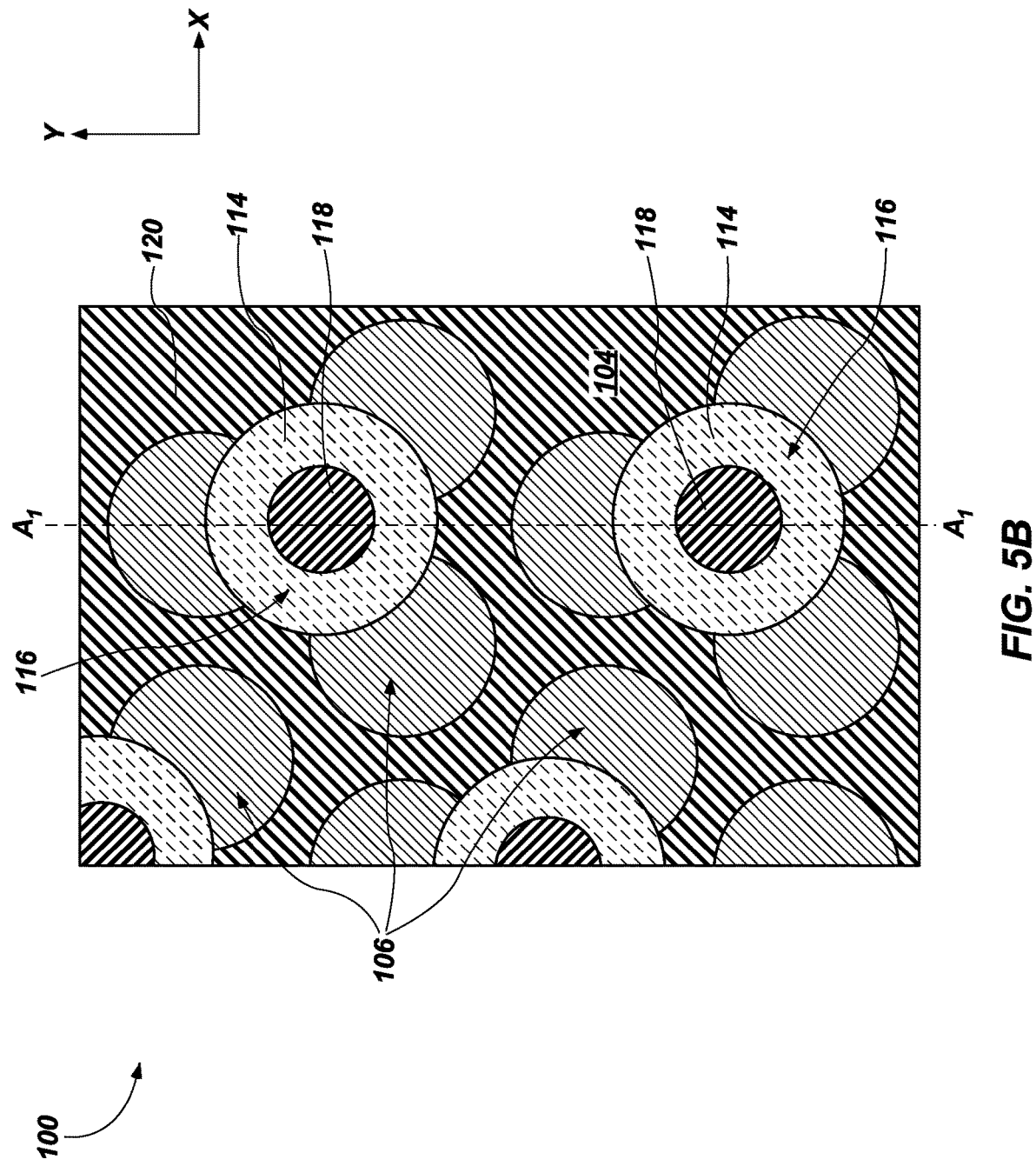

Referring next to FIG. 5A, a plate electrode 120 may be formed on or over an exposed surface (e.g., an exposed uppermost surface) of the second capacitor electrode material 112. As shown in FIG. 5A, the plate electrode 120 may continuously extend across an uppermost surface of the second capacitor electrode material 112. FIG. 5B is a simplified partial top-down of the apparatus 100 at the process stage depicted in FIG. 5A, wherein the plate electrode 120 is depicted as transparent to show the other components of the apparatus 100 provided thereunder.

The plate electrode 120 may be formed of and include at least one electrically conductive material, such as one or more of a metal, an alloy, a conductive metal oxide, a conductive metal nitride, a conductive metal silicide, and a conductively doped semiconductor material. By way of non-limiting example, the plate electrode 120 may be formed of and include one or more of W, WN, Ni, Ta, TaN, TaSi, Pt, Cu, Ag, Au, Al, Mo, Ti, TiN, TiSi, TiSiN, TiAlN, MoN, Ir, $IrO_x$, Ru, $RuO_x$, and conductively doped silicon. A material composition of the plate electrode 120 may be substantially the same as the material compositions of the first capacitor electrodes 106 and the second capacitor electrodes 118, or the material composition of the plate electrode 120 may be different than that of one or more (e.g., each) of the first capacitor electrodes 106 and second capacitor electrodes 118. In some embodiments, the plate electrode 120 is formed of and includes Ru. In further embodiments, plate electrode 120 is formed of and includes TiN.

The plate electrode 120 may be formed and positioned by conventional processes (e.g., conventional deposition processes, such as at least one of in situ growth, spin-on coating, blanket coating, CVD, PECVD, ALD, and PVD) and conventional processing equipment, which are not described in detail herein.

In additional embodiments, at the processing stage previously discussed with reference to FIGS. 4A and 4B, the second capacitor electrode material 112 and the capacitor dielectric material 110 may be subject to CMP so that uppermost surfaces of the capacitor dielectric structures 114, the second capacitor electrodes 118, the first capacitor electrodes 106, and the isolation material 104 are substantially coplanar with one another. An electrically insulating material may then be deposited over the substantially coplanar uppermost surfaces of the capacitor dielectric structures 114, the second capacitor electrodes 118, the first capacitor electrodes 106, and the isolation material 104. Thereafter, contact holes (e.g., through vias) may be formed in the electrically insulating material to expose the uppermost surfaces of the second capacitor electrodes 118. The plate electrode 120 may then be within and between the contact holes to electrically couple the second capacitor electrodes 118 to one another.

In additional embodiments, the apparatus 100 is formed to exhibit different geometric configurations (e.g., different shapes, different dimensions) of one or more components (e.g., features, structures, materials) thereof. By way of non-limiting example, FIGS. 6A through 9B are simplified partial cross-sectional (i.e., FIGS. 6A, 7A, 8A, and) and simplified partial top-down (i.e., FIGS. 6B, 7B, 8B, and 9B) views illustrating embodiments of another method of forming an apparatus (e.g., an electronic device; a semiconductor device; a memory device, such as a DRAM device). To avoid repetition, not all features shown in FIGS. 6A through 9B are described in detail herein. Rather, unless described otherwise below, a feature designated by a reference numeral that is a 100 increment of the reference numeral of a previously-described feature will be understood to be substantially similar to the previously-described feature and will also be understood to be formed in substantially the same manner as the previously-described feature.

Figure 6B:
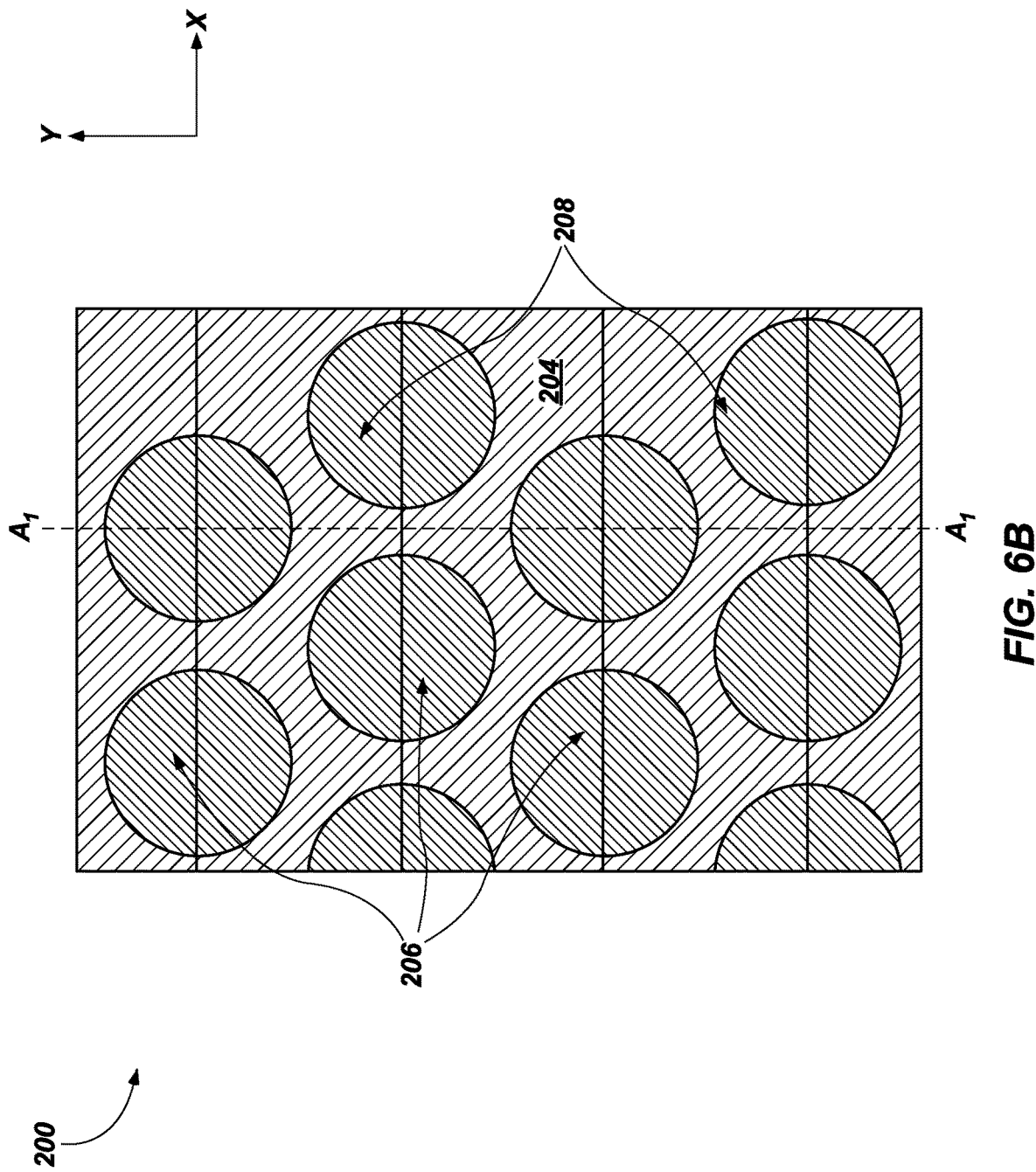
FIGS. 6A through 9B are simplified partial cross-sectional (i.e., FIGS. 6A, 7A, 8A, and 9A) and simplified partial top-down (i.e., FIGS. 6B, 7B, 8B, and 9B) views illustrating embodiments of a method of forming another electronic device, in accordance with additional embodiments of the disclosure.

Referring to FIG. 6A, an apparatus 200 may be formed to include may include an etch stopping material 202, an isolation material 204 (e.g., an ILD material) on or over the etch stopping material 202, first capacitor electrodes 206 vertically extending through the isolation material 204 and the etch stopping material 202, and openings 208 (e.g., trenches) vertically-extending (e.g., in the Z-direction shown in FIG. 6A) to the etch stopping material 202 and horizontally intervening (e.g., in the X-direction and the Y-direction) between laterally-neighboring first capacitor electrodes 206. The etch stopping material 202, the isolation material 204, and the first capacitor electrodes 206 may respectively be substantially similar to and may respectively be formed in substantially the same manner as the etch stopping material 102, the isolation material 104, and the first capacitor electrodes 106 previously described with reference to FIGS. 1A and 1B. As shown in FIG. 6A, portions of the first capacitor electrodes 206 vertically at or below upper surfaces of the etch stopping material 202 may underlie the openings 208. FIG. 6B is a simplified partial top-down of the apparatus 100 at the process stage depicted in FIG. 6A.

The openings 208 are formed to exhibit different geometric configurations (e.g., different shapes, different sizes) than the openings 108 previously described with reference to FIGS. 2A and 2B. As shown in FIG. 6B, rather than being formed to exhibit a circular column shape, the openings 208 may be formed to exhibit a rectangular prism shape having one or more relative greater lateral dimensions (e.g., in one or more of the X-direction and the Y-direction) than the openings 108 (FIGS. 2A and 2B). For example, the openings 208 may comprise trenches continuously laterally extending in parallel in the X-direction between laterally-neighboring first capacitor electrodes 206.

With continued reference to FIG. 6B, each of the openings 208 may be formed to horizontally intervene in the Y-direction between neighboring rows of the first capacitor electrodes 206, wherein each row of the first capacitor electrodes 206 lateral extends in the X-direction perpendicular to the Y-direction. For each of the openings 208, a lateral center of the opening 208 in the Y-direction may be positioned along a plane (e.g., a YZ plane, where Z is the Z-direction shown in FIG. 6A) laterally equidistant from the neighboring rows of first capacitor electrodes 206 associated therewith. As shown in FIG. 6B, the openings 208 do not horizontally intervene in the X-direction between neighboring columns of the first capacitor electrodes 206, wherein each column of the first capacitor electrodes 206 lateral extends in the Y-direction. In additional embodiments, the openings 208 are formed to horizontally intervene in the X-direction between neighboring columns of the first capacitor electrodes 206, and do not horizontally intervene in the Y-direction between neighboring rows of the first capacitor electrodes 206.

The openings 208 may be formed in the isolation material 204 and the first capacitor electrodes 206 using conventional processes, which are not described in detail herein. By way of non-limiting example, portions of the isolation material 204 and the first capacitor electrodes 206 may be subjected to at least one anisotropic etching process (e.g., an anisotropic dry etching process, such as one or more of RIE, deep RIE, plasma etching, reactive ion beam etching, and chemically assisted ion beam etching) to form the openings 208.

Figure 7A:
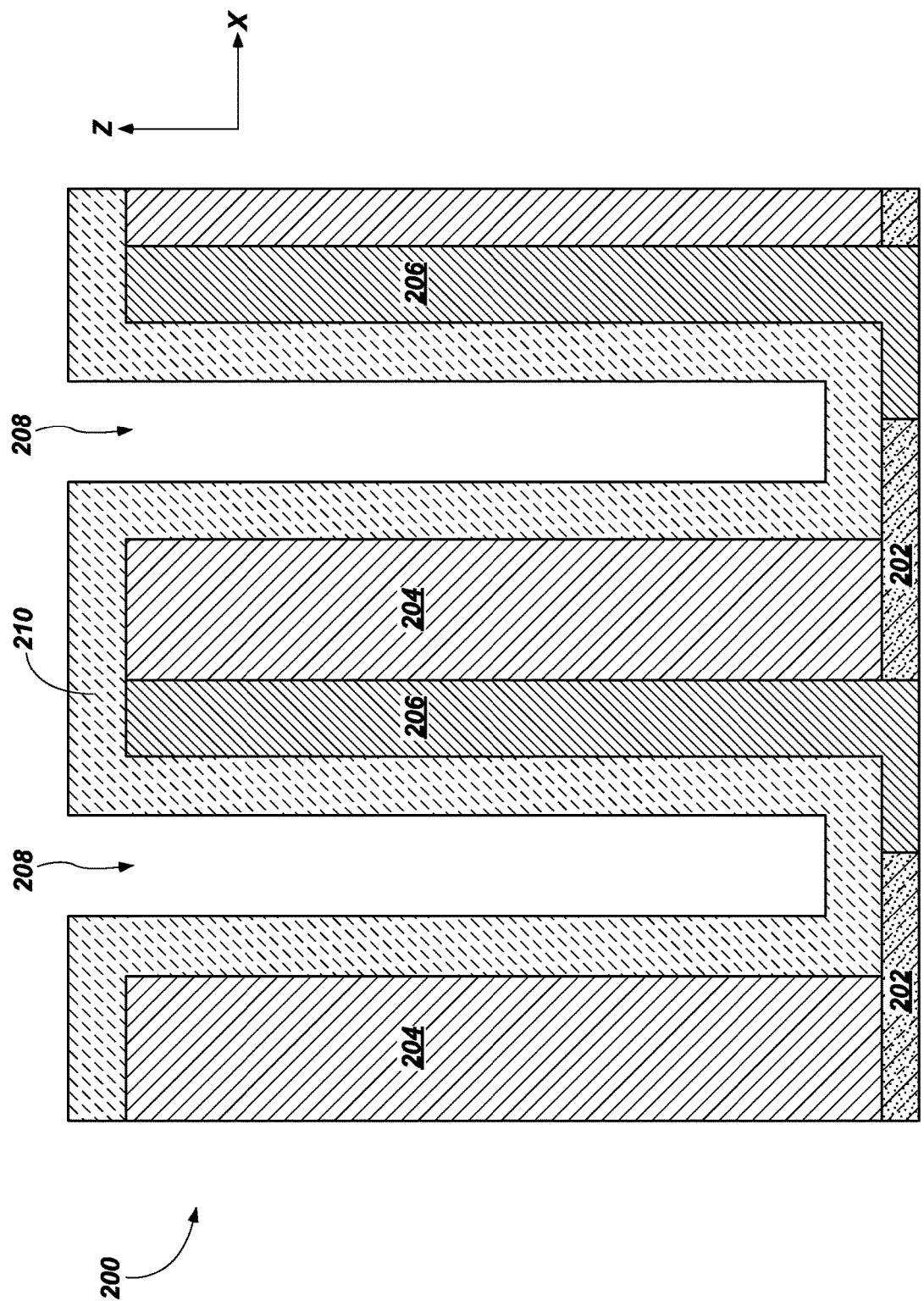
Figure 7B:
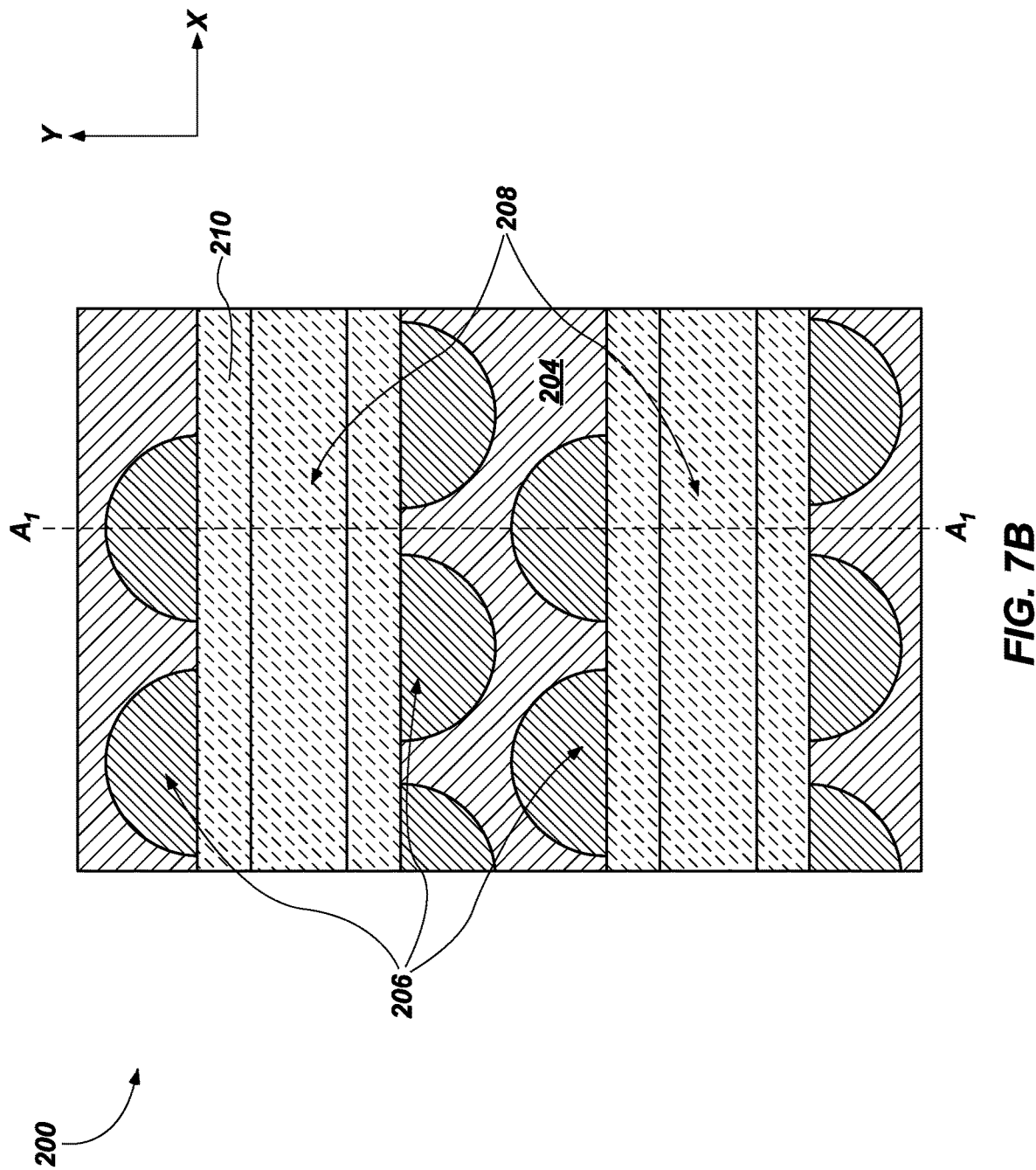

Referring next to FIG. 7A, a capacitor dielectric material 210 may be formed on or over exposed surfaces of the apparatus 200 (e.g., exposed surfaces of the isolation material 204 and the first capacitor electrodes 206). As shown in FIG. 7A, the capacitor dielectric material 210 may at least partially (e.g., substantially) conform to a topography defined by the surfaces (e.g., upper surfaces, side surfaces) upon which the capacitor dielectric material 210 is formed. The capacitor dielectric material 210 may extend (e.g., continuously extend) over surfaces (e.g., upper surfaces, side surfaces) of isolation material 204 and the first capacitor electrodes 206 inside and outside of the openings 208. The capacitor dielectric material 210 partially (e.g., less than completely) fills the openings 208. The capacitor dielectric material 210 may be formed to any desired thickness, at least partially depending the lateral distances between the neighboring rows of the first capacitor electrodes 206 associated with each of the openings 208. FIG. 7B is a simplified partial top-down of the apparatus 200 at the process stage depicted in FIG. 7A, wherein the capacitor dielectric material 210 is depicted as transparent to show the other components of the apparatus 200 provided thereunder.

A material composition of the capacitor dielectric material 210 may be substantially similar to the material composition of the capacitor dielectric material 110 previously described with reference to FIGS. 3A and 3B. In addition, the capacitor dielectric material 210 may be formed in substantially the same manner as the capacitor dielectric material 110 previously described with reference to FIGS. 3A and 3B.

Figure 8A:
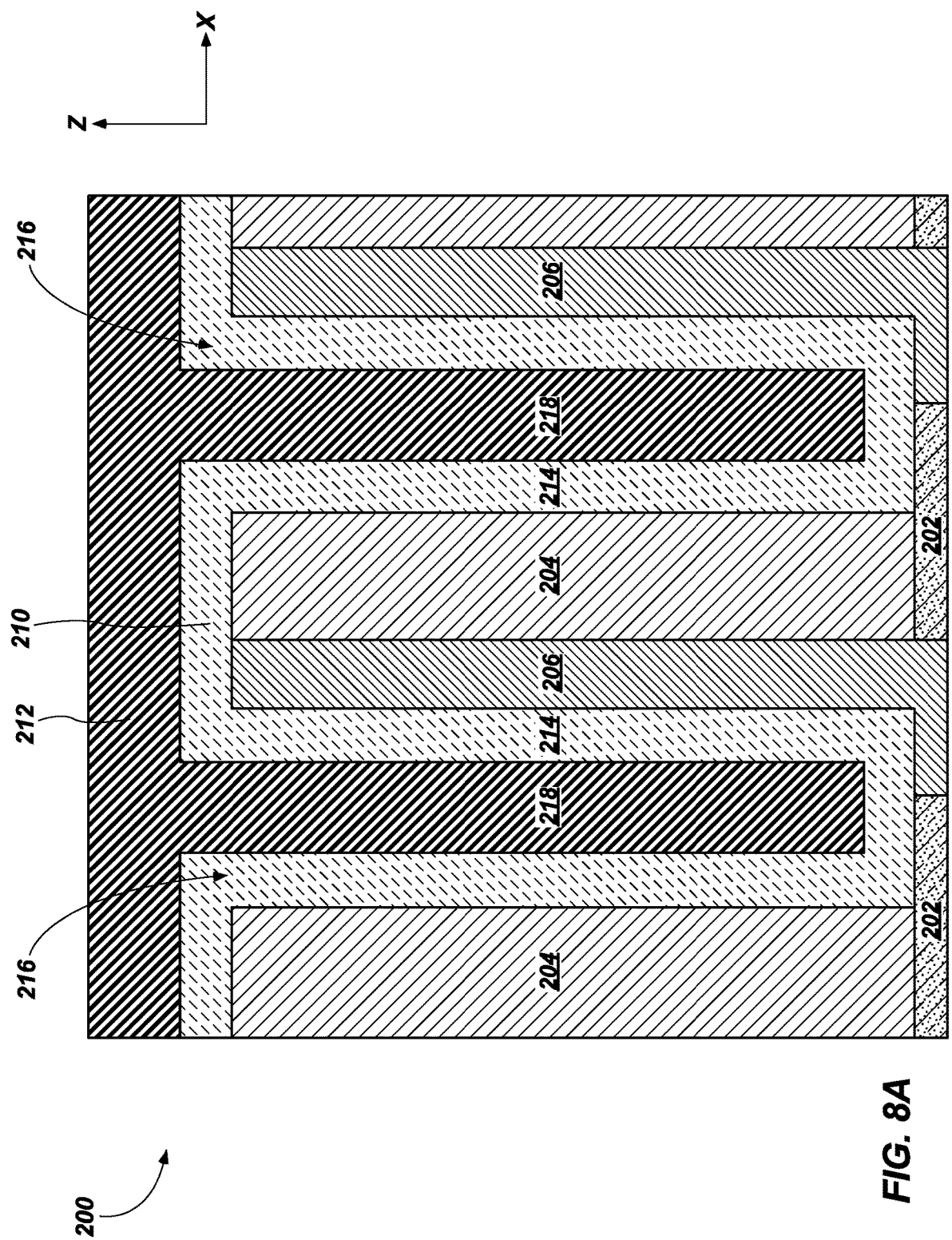
Figure 8B:
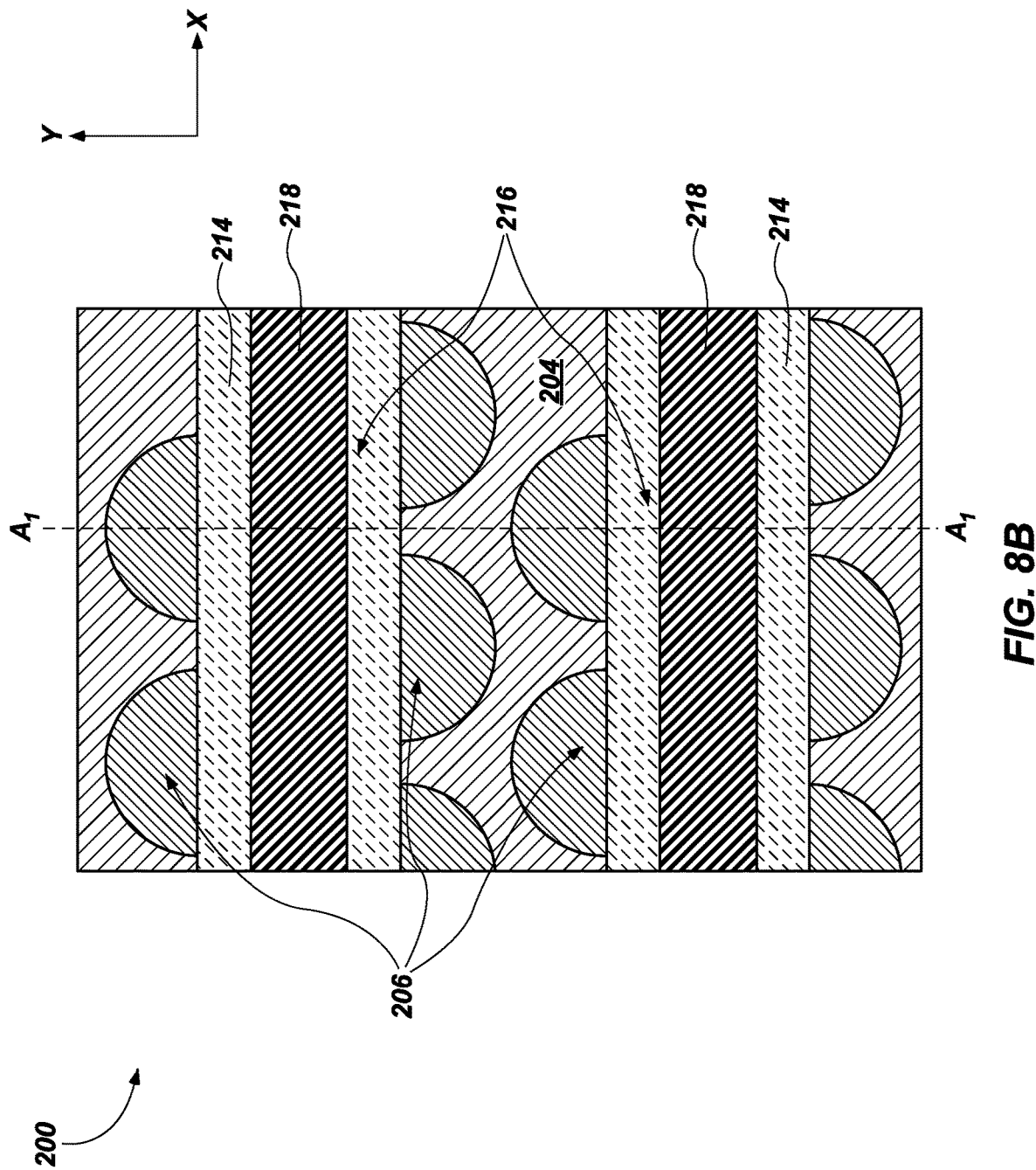

Referring next to FIG. 8A, a second capacitor electrode material 212 (e.g., an upper capacitor electrode material) may be formed on or over the capacitor dielectric material 210. The second capacitor electrode material 212 may substantially fill remainders of the openings 208 (FIGS. 7A and 7B). The second capacitor electrode material 212 may be substantially free of void spaces (e.g., air gaps) therein. The upper surface of the second capacitor electrode material 112 may be planarized as needed. As shown in FIG. 8A, the formation of the second capacitor electrode material 212 may effectuate the formation of capacitors 216 of the apparatus 200. Each of the capacitors 216 may individually include a first capacitor electrode 206, a second capacitor electrode 218 formed of a portion of the second capacitor electrode material 212, and a capacitor dielectric structure 214 formed of a portion of the capacitor dielectric material 210. FIG. 8B is a simplified partial top-down of the apparatus 200 at the process stage depicted in FIG. 8A.

As shown in FIG. 8A, each of the capacitor dielectric structures 214 may comprise a container-shaped structure, including and one or more sidewalls integral with a floor. The sidewalls and the floors the capacitor dielectric material 210 may substantially (e.g., completely) cover side surfaces and lower surfaces of the second capacitor electrodes 218. As shown in FIG. 8B, in some embodiments, each of the capacitor dielectric structures 214 includes a sidewall having a substantially annular the lateral cross-sectional shape. The second capacitor electrodes 218 may be substantially contained (e.g., confined) within boundaries (e.g., vertical boundaries, horizontal boundaries) of the capacitor dielectric structures 214. The capacitor dielectric structures 214 may each individually substantially physically separate the second capacitor electrode 218 contained therein from the first capacitor electrodes 206 laterally neighboring the second capacitor electrode 218. Put another way, the capacitor dielectric structures 214 may each individually horizontally and vertically intervene between the second capacitor electrode 218 contained therein and the first capacitor electrodes 206 laterally neighboring the second capacitor electrode 218.

Each of the second capacitor electrodes 218 may exhibit a size, a shape, and spacing complementary to a size, a shape, and spacing of the unfilled portion of the opening 208 (FIGS. 7A and 7B) within which the second capacitor electrode 218 is formed. The second capacitor electrodes 218 may, for example, each individually exhibit a rectangular prism shape. As shown in FIG. 8B, the second capacitor electrodes 218 may continuously laterally extend in parallel in the X-direction between neighboring rows of the first capacitor electrodes 206. Each of the second capacitor electrodes 218 may horizontally intervene in the Y-direction between neighboring rows of the first capacitor electrodes 206, and may not horizontally intervene in the X-direction between neighboring columns of the first capacitor electrodes 206. For each of the second capacitor electrodes 218, a lateral center of the second capacitor electrode 218 in the Y-direction may be positioned at a location laterally equidistant from each of the laterally-neighboring rows of the first capacitor electrodes 206 associated therewith. Each of the second capacitor electrodes 218 may substantially equally laterally extend (i.e., in the Y-direction) beyond outermost lateral boundaries of the first capacitor electrodes 206 of each of the laterally-neighboring rows of the first capacitor electrodes 206 associated therewith. In additional embodiments (e.g., embodiments wherein the openings 208 (FIGS. 6A and 6B) are formed to laterally extend in the Y-direction between neighboring columns of the first capacitor electrodes 206), the second capacitor electrodes 218 are formed to horizontally intervene in the X-direction between neighboring columns of the first capacitor electrodes 206, and do not horizontally intervene in the Y-direction between neighboring rows of the first capacitor electrodes 206.

A material composition of the second capacitor electrode material 112 (and hence second capacitor electrodes 218) may be substantially similar to the material composition of the second capacitor electrode material 112 (and hence the second capacitor electrodes 118) previously described with reference to FIGS. 4A and 4B. In addition, the second capacitor electrode material 212 may be formed in substantially the same manner as the second capacitor electrode material 112 previously described with reference to FIGS. 4A and 4B.

Figure 9A:
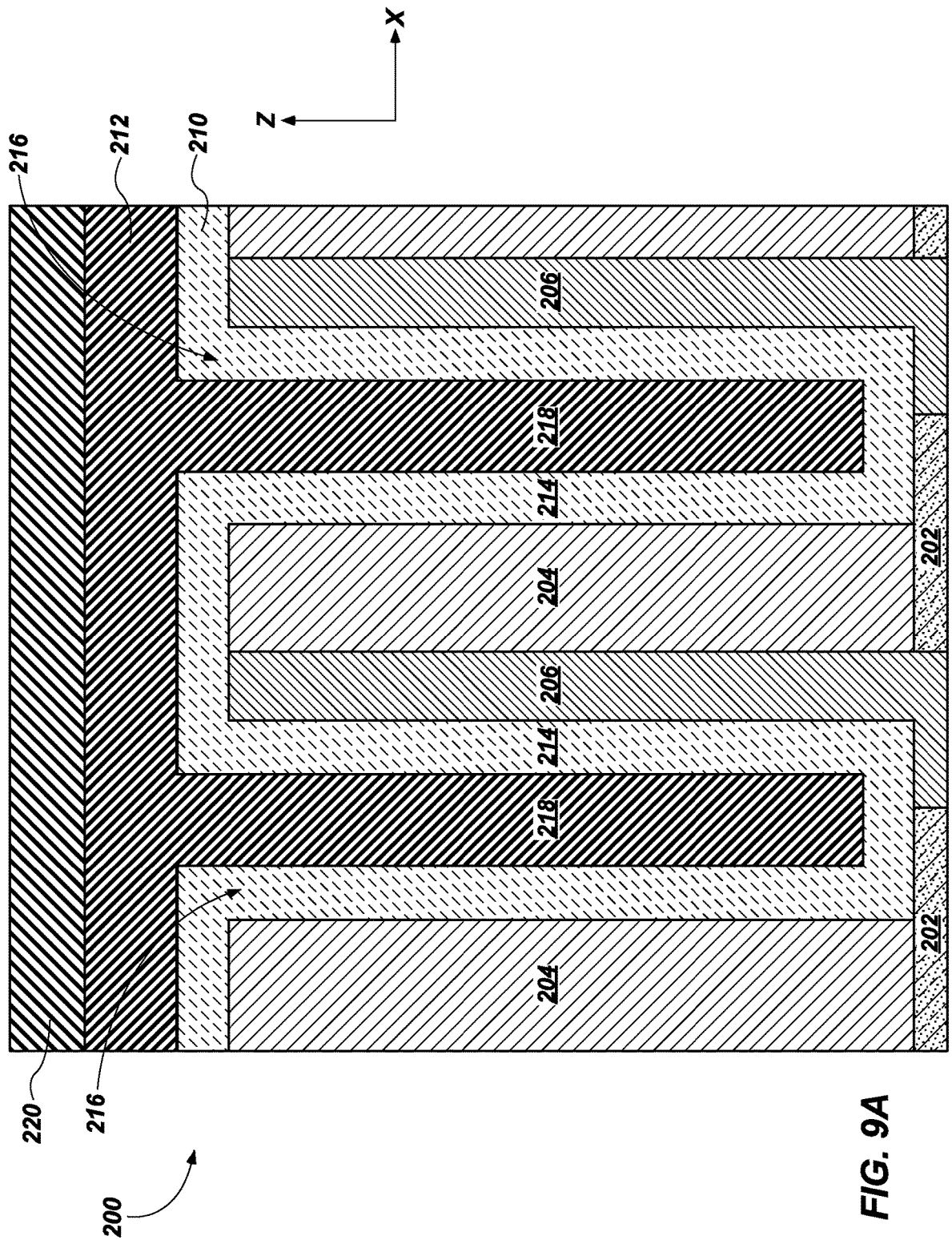
Figure 9B:
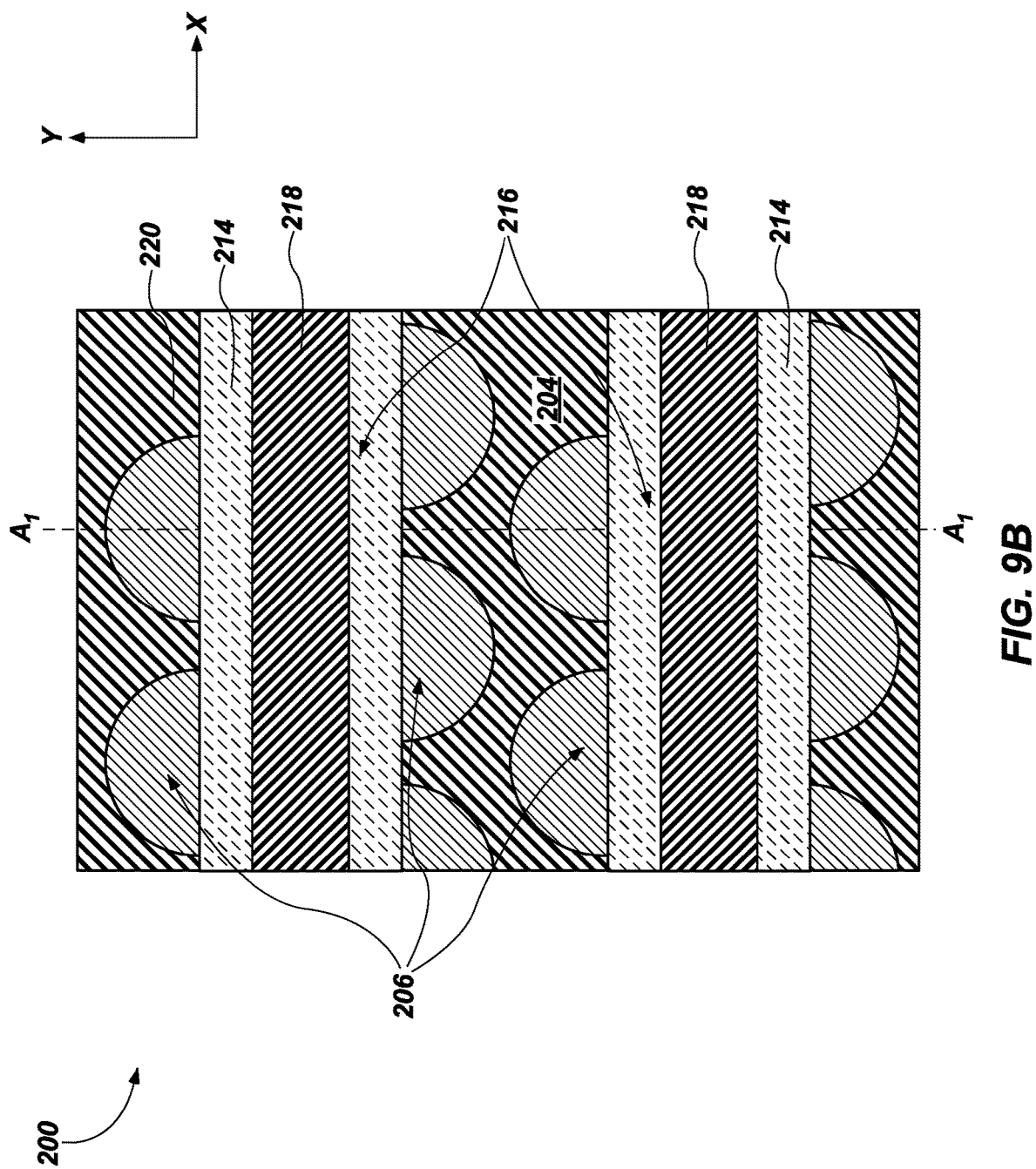

Referring next to FIG. 9A, a plate electrode 220 may be formed on or over an exposed surface (e.g., an exposed uppermost surface) of the second capacitor electrode material 212. As shown in FIG. 9A, the plate electrode 220 may continuously extend across an uppermost surface of the second capacitor electrode material 212. FIG. 9B is a simplified partial top-down of the apparatus 200 at the process stage depicted in FIG. 9A, wherein the plate electrode 220 is depicted as transparent to show the other components of the apparatus 200 provided thereunder.

A material composition of the plate electrode 220 may be substantially similar to the material composition of the plate electrode 120 previously described with reference to FIGS. 5A and 5B. In addition, the plate electrode 220 may be formed in substantially the same manner as the plate electrode 120 previously described with reference to FIGS. 5A and 5B.

In additional embodiments, at the processing stage previously discussed with reference to FIGS. 8A and 8B, the second capacitor electrode material 212 and the capacitor dielectric material 210 may be subject to CMP so that uppermost surfaces of the capacitor dielectric structures 214, the second capacitor electrodes 218, the first capacitor electrodes 206, and the isolation material 204 are substantially coplanar with one another. An electrically insulating material may then be deposited over the substantially coplanar uppermost surfaces of the capacitor dielectric structures 214, the second capacitor electrodes 218, the first capacitor electrodes 206, and the isolation material 204. Thereafter, contact holes (e.g., through vias) may be formed in the electrically insulating material to expose the uppermost surfaces of the second capacitor electrodes 218. The plate electrode 220 may then be within and between the contact holes to electrically couple the second capacitor electrodes 218 to one another.

Figure 10:
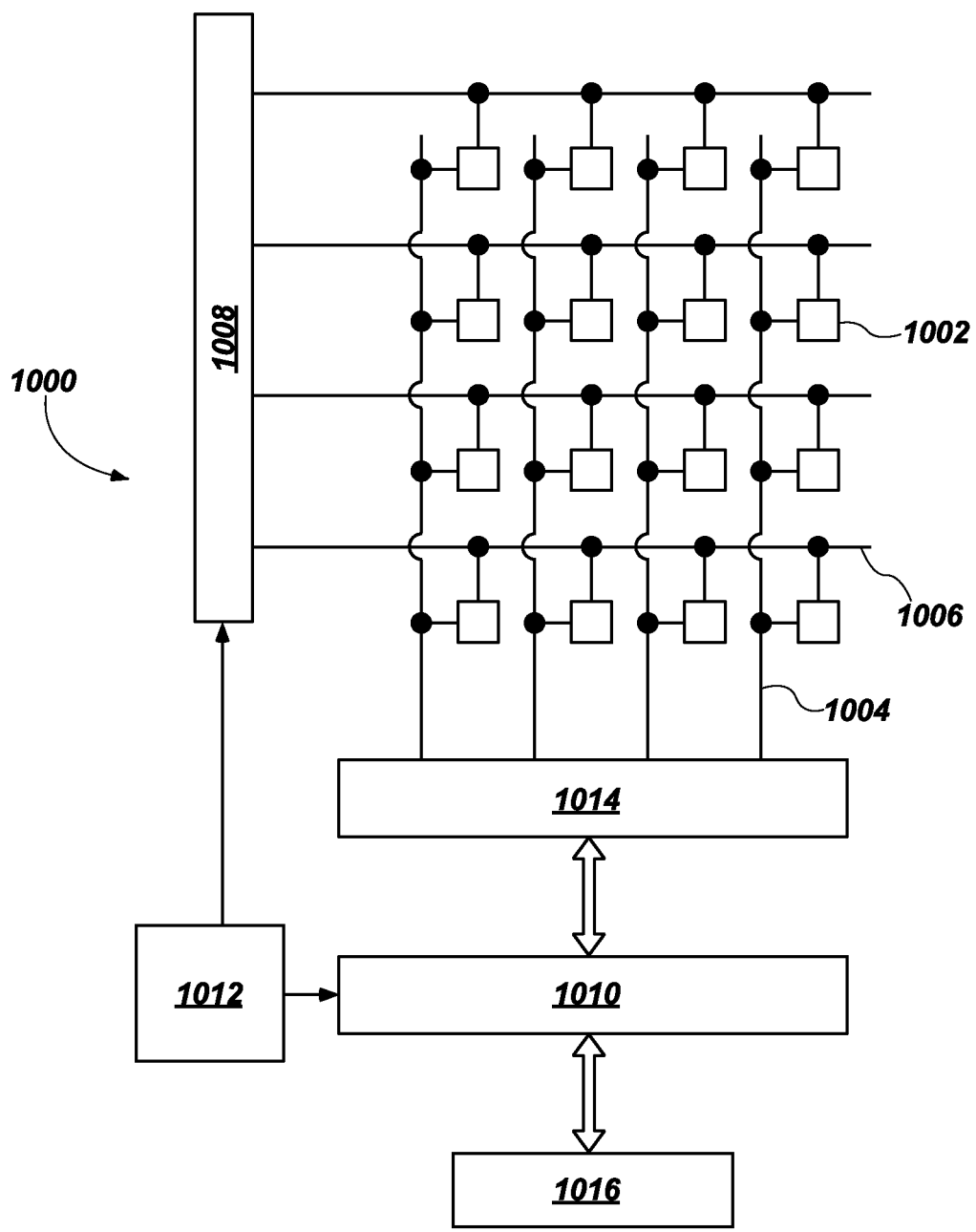
FIG. 10 is a functional block diagram of a memory device, in accordance with an embodiment of the disclosure.

FIG. 10 illustrates a functional block diagram of a memory device 1000 (e.g., a DRAM device), in accordance with an embodiment of the disclosure. The memory device 1000 may include, for example, an embodiment of one or more of the apparatus 100 (FIGS. 5A and 5B) and the apparatus 200 (FIGS. 9A and 9B) previously described herein. As shown in FIG. 10, the memory device 1000 may include memory cells 1002, digit lines 1004, word lines 1006, a row decoder 1008, a column decoder 1010, a memory controller 1012, a sense device 1014, and an input/output device 1016.

The memory cells 1002 of the memory device 1000 are programmable to at least two different logic states (e.g., logic 0 and logic 1). Each memory cell 1002 may individually include a capacitor (e.g., one of the capacitors 116 previously described with reference to FIGS. 4A and 4B; one of the capacitors 216 previously described with reference to FIGS. 8A and 8B) and transistor. The capacitor stores a charge representative of the programmable logic state (e.g., a charged capacitor may represent a first logic state, such as a logic 1; and an uncharged capacitor may represent a second logic state, such as a logic 0) of the memory cell 1002. The transistor grants access to the capacitor upon application (e.g., by way of one of the word lines 1006) of a minimum threshold voltage to a semiconductive channel thereof for operations (e.g., reading, writing, rewriting) on the capacitor.

The digit lines 1004 are connected to the capacitors of the memory cells 1002 by way of the transistors of the memory cells 1002. The word lines 1006 extend perpendicular to the digit lines 1004, and are connected to gates of the transistors of the memory cells 1002. Operations may be performed on the memory cells 1002 by activating appropriate digit lines 1004 and word lines 1006. Activating a digit line 1004 or a word line 1006 may include applying a voltage potential to the digit line 1004 or the word line 1006. Each column of memory cells 1002 may individually be connected to one of the digit lines 1004, and each row of the memory cells 1002 may individually be connected to one of the word lines 1006. Individual memory cells 1002 may be addressed and accessed through the intersections (e.g., cross points) of the digit lines 1004 and the word lines 1006.

The memory controller 1012 may control the operations of memory cells 1002 through various components, including the row decoder 1008, the column decoder 1010, and the sense device 1014. The memory controller 1012 may generate row address signals that are directed to the row decoder 1008 to activate (e.g., apply a voltage potential to) predetermined word lines 1006, and may generate column address signals that are directed to the column decoder 1010 to activate (e.g., apply a voltage potential to) predetermined digit lines 1004. The memory controller 1012 may also generate and control various voltage potentials employed during the operation of the memory device 1000. In general, the amplitude, shape, and/or duration of an applied voltage may be adjusted (e.g., varied), and may be different for various operations of the memory device 1000.

During use and operation of the memory device 1000, after being accessed, a memory cell 1002 may be read (e.g., sensed) by the sense device 1014. The sense device 1014 may compare a signal (e.g., a voltage) of an appropriate digit line 1004 to a reference signal in order to determine the logic state of the memory cell 1002. If, for example, the digit line 1004 has a higher voltage than the reference voltage, the sense device 1014 may determine that the stored logic state of the memory cell 1002 is a logic 1, and vice versa. The sense device 1014 may include transistors and amplifiers to detect and amplify a difference in the signals (commonly referred to in the art as "latching"). The detected logic state of a memory cell 1002 may be output through the column decoder 1010 to the input/output device 1016. In addition, a memory cell 1002 may be set (e.g., written) by similarly activating an appropriate word line 1006 and an appropriate digit line 1004 of the memory device 1000. By controlling the digit line 1004 while the word line 1006 is activated, the memory cell 1002 may be set (e.g., a logic value may be stored in the memory cell 1002). The column decoder 1010 may accept data from the input/output device 1016 to be written to the memory cells 1002. Furthermore, a memory cell 1002 may also be refreshed (e.g., recharged) by reading the memory cell 1002. The read operation will place the contents of the memory cell 1002 on the appropriate digit line 1004, which is then pulled up to full level (e.g., full charge or discharge) by the sense device 1014. When the word line 1006 associated with the memory cell 1002 is deactivated, all of memory cells 1002 in the row associated with the word line 1006 are restored to full charge or discharge.

Thus, a memory device according to embodiments of the disclosure comprises word lines, digit lines, and memory cells electrically coupled to the word lines and the digit lines. Each of the memory cells comprises a transistor electrically coupled to at least one of the word lines, and a capacitor electrically coupled to the transistor and comprising a first capacitor electrode, a capacitor dielectric structure, and a second capacitor electrode. The first capacitor electrode exhibits a columnar shape vertically extending through at least one dielectric material. The capacitor dielectric structure exhibits container shape horizontally adjacent the first capacitor electrode and vertically overlying a lower portion of the first capacitor electrode. The second capacitor electrode is horizontally adjacent the capacitor dielectric structure.

Figure 11:
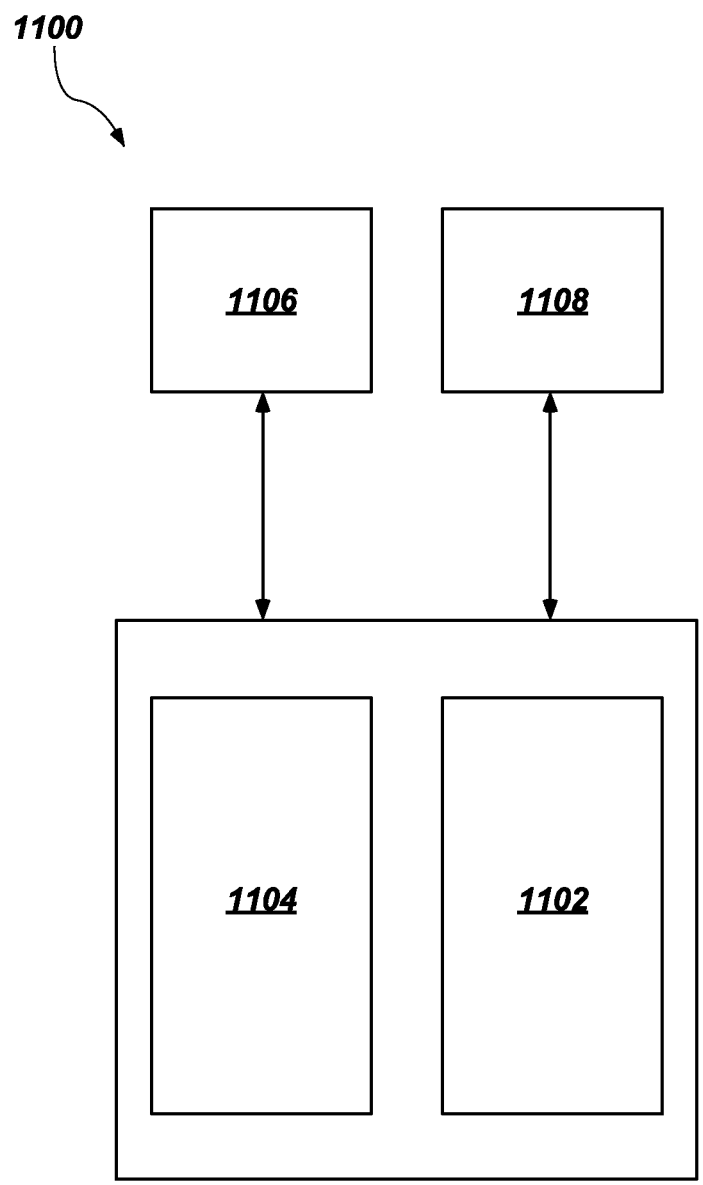
FIG. 11 is a schematic block diagram of an electronic system, in accordance with an embodiment of the disclosure.

Apparatuses (e.g., the apparatus 100 previously described with reference to FIGS. 5A and 5B; the apparatus 200 previously described with reference to FIGS. 9A and 9B) and electronic devices (e.g., the memory device 1000 previously described with reference to FIG. 10) in accordance with embodiments of the disclosure may be used in embodiments of electronic systems of the disclosure. For example, FIG. 11 is a block diagram of an illustrative electronic system 1100 according to embodiments of disclosure. The electronic system 1100 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 1100 includes at least one memory device 1102. The memory device 1102 may comprise, for example, an embodiment of one or more of an apparatus (e.g., the apparatus 100 previously described with reference to FIGS. 5A and 5B; the apparatus 200 previously described with reference to FIGS. 9A and 9B) and an electronic device (e.g., the memory device 1000 previously described with reference to FIG. 10) previously described herein. The electronic system 1100 may further include at least one electronic signal processor device 1104 (often referred to as a "microprocessor"). The electronic signal processor device 1104 may, optionally, include an embodiment of an apparatus (e.g., the apparatus 100 previously described with reference to FIGS. 5A and 5B; the apparatus 200 previously described with reference to FIGS. 9A and 9B) and an electronic device (e.g., the memory device 1000 previously described with reference to FIG. 10) previously described herein. The electronic system 1100 may further include one or more input devices 1106 for inputting information into the electronic system 1100 by a user, such as, for example, a mouse or other pointing device, a keyboard, a touchpad, a button, or a control panel. The electronic system 1100 may further include one or more output devices 1108 for outputting information (e.g., visual or audio output) to a user such as, for example, a monitor, a display, a printer, an audio output jack, a speaker, etc. In some embodiments, the input device 1106 and the output device 1108 may comprise a single touchscreen device that can be used both to input information to the electronic system 1100 and to output visual information to a user. The input device 1106 and the output device 1108 may communicate electrically with one or more of the memory device 1102 and the electronic signal processor device 1104.

Thus, an electronic system according to embodiments of the disclosure comprises an input device, an output device, a processor device operably coupled to the input device and the output device, and a memory device operably coupled to the processor device. The memory device comprises lower capacitor electrodes vertically extending through one or more dielectric materials, an upper capacitor electrode laterally intervening between at least three of the lower capacitor electrodes, and a capacitor dielectric structure completely physically intervening between the upper capacitor electrode and the at least three of the lower capacitor electrodes.

The structures, apparatuses, electronic devices (e.g., memory devices), electronic systems, and methods of the disclosure facilitate improved performance, reduced costs (e.g., manufacturing costs, material costs), increased miniaturization of components, and greater packaging density as compared to conventional structures, conventional apparatuses, conventional devices, conventional systems, and conventional methods. The structures, apparatuses, electronic devices, electronic systems, and methods of the disclosure may also improve scalability, efficiency, and simplicity as compared to conventional structures, conventional apparatuses, conventional devices, conventional systems, and conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. An apparatus, comprising:
    first electrodes vertically extending through a dielectric material and an isolation material on the dielectric material;
    a second electrode vertically overlying the dielectric material and horizontally intervening between two or more of the first electrodes laterally neighboring one another; and
    a dielectric structure horizontally and vertically intervening between the second electrode and the two or more of the first electrodes, the dielectric structure physically contacting the dielectric material, the isolation material, the second electrode, and the two or more of the first electrodes.

2. The apparatus of claim 1, wherein the first electrodes are arranged in a hexagonal pattern.

3. The apparatus of claim 1, wherein portions of each of the two or more of the first electrodes vertically underlie the second electrode.

4. The apparatus of claim 1, wherein the first electrodes and the second electrode exhibit cylindrical column shapes.

5. The apparatus of claim 4, wherein:
    the second electrode horizontally intervenes between three of the first electrodes laterally neighboring one another; and
    the dielectric structure horizontally and vertically intervenes between the second electrode and each of the three of the first electrodes.

6. The apparatus of claim 5, wherein a lateral center of the second electrode is laterally equidistant from each of the three of the first electrodes.

7. The apparatus of claim 1, wherein the first electrodes exhibit a cylindrical column shape and the second electrode exhibits a rectangular prism shape.

8. The apparatus of claim 7, wherein:
    the second electrode horizontally intervenes between two laterally-neighboring rows of the first electrodes; and
    the dielectric structure horizontally and vertically intervenes between the second electrode and each first electrode of each of the two laterally-neighboring rows of the first electrodes.

9. The apparatus of claim 8, wherein a lateral center of the second electrode is laterally equidistant from laterally equidistant from each of the two laterally-neighboring rows of the first electrodes.

10. The apparatus of claim 1, wherein the dielectric structure comprises a container-shaped structure having at least one sidewall integral with a floor, the dielectric structure substantially covering side surfaces and a lower surface of the second electrode.

11. The apparatus of claim 1, wherein a material composition of the dielectric material is different than a material composition of the isolation material.

12. The apparatus of claim 11, wherein:
    the dielectric material comprises a dielectric nitride material; and
    the isolation material comprises a dielectric oxide material.

13. The apparatus of claim 1, wherein the dielectric structure and the isolation material each physically contact an upper surface of the dielectric material.

14. The apparatus of claim 13, wherein the dielectric structure horizontally extends from and between the isolation material and the second electrode.

15. The apparatus of claim 14, wherein the dielectric structure also horizontally extends from and between the second electrode and each of the two or more of the first electrodes.

16. A method of forming an apparatus, comprising:
    forming first electrodes vertically extending through a dielectric material and an isolation material on the dielectric material;
    removing portions of the first electrodes and the isolation material to form openings each individually horizontally intervening between two or more of the first electrodes laterally neighboring one another;
    forming a dielectric structure on surfaces of the first electrodes, dielectric material, and the isolation material inside and outside of the openings; and
    forming second electrodes overlying the dielectric structure and filling remaining portions of the openings, each of the second electrodes vertically overlying the dielectric material and horizontally intervening between the two or more of the first electrodes.

17. The method of claim 16, wherein forming first electrodes vertically extending through a dielectric material and an isolation material on the dielectric material comprises forming each of the first electrodes to have a cylindrical column shape and to vertically extend completely through the isolation material and the dielectric material.

18. The method of claim 16, wherein forming first electrodes vertically extending through a dielectric material and an isolation material on the dielectric material comprises forming a hexagonal pattern of the first electrodes.

19. The method of claim 16, wherein removing portions of the first electrodes and the isolation material to form openings each individually horizontally intervening between two or more of the first electrodes laterally neighboring one another comprises forming the openings to each individually vertically overlie lower portions of the two or more of the first electrodes laterally neighboring one another.

20. The method of claim 16, wherein removing portions of the first electrodes and the isolation material to form openings each individually horizontally intervening between two or more of the first electrodes laterally neighboring one another comprises forming the openings to each exhibit a cylindrical column shape and to each individually horizontally intervene between three of the first electrodes laterally neighboring one another.

21. The method of claim 16, wherein removing portions of the first electrodes and the isolation material to form openings each individually horizontally intervening between two or more of the first electrodes laterally neighboring one another comprises forming the openings to each exhibit a rectangular prism shape and to each individually horizontally intervene between two laterally neighboring rows of the first electrodes.

22. The method of claim 16, wherein forming a dielectric material over surfaces of the first electrodes and the isolation material inside and outside of the openings comprises forming the dielectric material to completely cover exposed surfaces of the first electrodes within the openings.

\* \* \* \* \*